United States Patent [19]
Burnett

[11] Patent Number: 5,270,661
[45] Date of Patent: Dec. 14, 1993

[54] METHOD OF DETECTING A CONDUCTOR ANOMALY BY APPLYING PULSES ALONG THE CONDUCTOR IN OPPOSITE DIRECTIONS

[75] Inventor: Gale D. Burnett, Lynden, Wash.

[73] Assignee: Pipeline Profiles, Ltd., Lynden, Wash.

[21] Appl. No.: 782,622

[22] Filed: Oct. 25, 1991

[51] Int. Cl.[5] .................... G01R 31/11; G01R 31/08
[52] U.S. Cl. ............................... 324/527; 324/532; 379/26
[58] Field of Search ............... 324/527, 532, 533, 534, 324/535, 637, 639, 642; 379/2, 3, 24, 26, 30, 31

[56] References Cited
U.S. PATENT DOCUMENTS

| | | |
|---|---|---|
| 2,113,749 | 12/1935 | Statham . |
| 2,602,834 | 7/1952 | Leslie et al. . |
| 2,725,526 | 11/1955 | Stringfield et al. . |
| 2,887,652 | 5/1959 | Bendayan et al. . |
| 3,600,674 | 8/1971 | Roberts et al. . |
| 3,924,179 | 12/1975 | Dozier . |
| 4,063,161 | 12/1977 | Pardis . |
| 4,118,662 | 10/1978 | Weber . |
| 4,289,019 | 9/1981 | Claytor . |
| 4,291,204 | 9/1981 | Crick . |
| 4,538,103 | 8/1985 | Cappon . |
| 4,739,276 | 4/1988 | Graube . |
| 4,755,742 | 7/1988 | Agoston et al. . |
| 4,970,467 | 11/1990 | Burnett . |

Primary Examiner—Gerard R. Strecker
Assistant Examiner—Diep Do
Attorney, Agent, or Firm—Hughes & Multer

[57] ABSTRACT

A system for analyzing electrically conductive members such as pipelines, in which electrical pulses are transmitted through said member to intersect at predetermined locations. At least one of the pulses which intersects the other pulse is analyzed to determine whether there is a variation in the intersecting pulses at locations along the length of the member. With the member being tested being a pipeline, in some embodiments, a direct current is applied to the pipeline and this also is used to analyze the condition of the pipeline and also the information provided by the intersecting pulses. Amplitude, frequency, and wave form variations of the intersecting pulses are analyzed to detect anomalies or other conditions along the pipeline or other member.

13 Claims, 18 Drawing Sheets

50 NANOSECONDS PER DIVISION

50 NANOSECONDS PER DIVISION

50 NANOSECONDS PER DIVISION

50 NANOSECONDS PER DIVISION

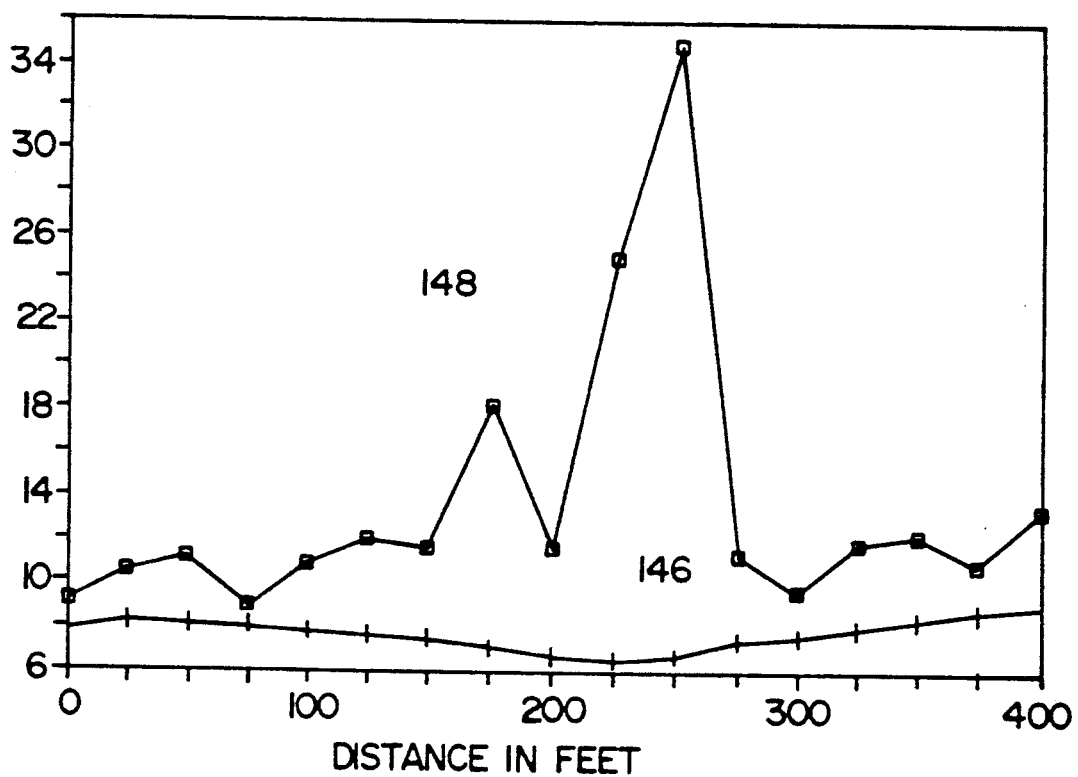

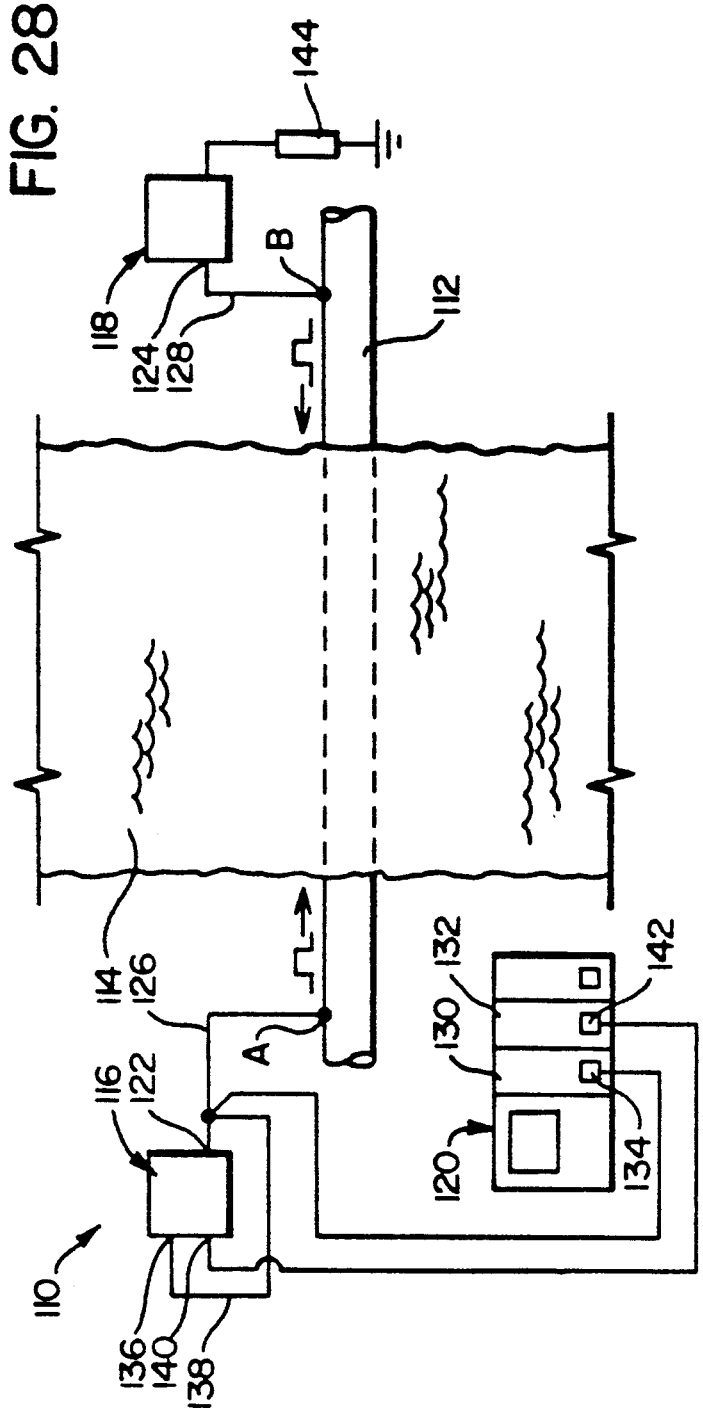

METHOD OF DETECTING A CONDUCTOR ANOMALY BY APPLYING PULSES ALONG THE CONDUCTOR IN OPPOSITE DIRECTIONS

BACKGROUND OF THE INVENTION

Cross Reference to Related Applications

The present patent application is being filed concurrently with two other patent applications by the same inventor, these being entitled "APPARATUS AND METHOD FOR PULSE PROPAGATION ANALYSIS OF A PIPELINE OR THE LIKE" and "APPARATUS AND METHOD FOR PULSE PROPAGATION ANALYSIS OF A WELL CASING OR THE LIKE" Ser. No. 782,565 and Ser. No. 782,559, now U.S. Pat. No. 5,189,374, respectively). The subject matter of these two other patent applications is hereby incorporated by reference, since some of the teachings contained in these other two applications may be useful in connection with teachings of the present patent application.

Field of the Invention

The present invention relates to an apparatus and method for analyzing conditions along a length of an elongate electrically conductive member, and more particularly to such an apparatus and method which is particularly adapted to detect the presence and location of anomalies along the length of a pipeline, such as an oil or gas pipeline that is buried underground or which extends along a floor of a body of water, as well as possibly other members, such as cables, metal structures, etc.

Background Art

The present invention was developed initially to analyze pipelines or the like. Pipelines which carry oil or some other fluid are often placed underground and extend for possibly hundreds of miles. Such pipelines are commonly made of metal (e.g., steel) and are wrapped with a protective layer of tape to prevent corrosion of the metal. Even so, the protective layer will sometimes deteriorate at certain locations, or possibly be abraded by some object (e.g., a rock which might come in contact with the protective layer) so as to expose the metal of the pipe to the adjacent ground, resulting in premature pipe corrosion.

In order to alleviate this corrosion of the pipeline, it is common to utilize a source of electrical direct current power to impart a negative charge to the pipeline relative to the adjacent ground. One method is to attach Galvanic anodes to the pipe (e.g. a magnesium anode). Another method is to provide a DC generator with the negative output being attached to the pipeline, while the positive output is connected to an electrode which is placed in the ground. However, this also has its shortcomings. For example, there can be a localized interfering electrical field which may reverse the electrical potential between the pipeline and the ground within an area. This electrical field could result, for example, from an adjacent pipeline which might cross (or extend adjacent to) another pipeline.

Accordingly, the pipeline industry has undertaken to analyze the conditions along the length of the various pipelines to determine the electrical potential between the pipeline and the adjacent ground. The common method of doing this is what is termed the "half-cell" process, which has more or less become the standard of the industry. A typical half-cell comprises a containing member which is a sealed plastic cylinder with a porous ceramic plug. A solution of copper sulfate is in the container and there is a piece of copper which extends into the solution of copper sulfate, with this copper being in turn attached to a wire which is then attached to a volt meter. The other lead of the volt meter would lead to a connection to the actual pipe itself. A somewhat crude method of taking half-cell readings would be to walk along the length of the pipe, dig a hole at selected locations to expose the pipe, attach one electrode to the pipe, and then stick the half-cell in the ground at that location to take a reading. Then the person would proceed to the next location along the pipeline and repeat the same process. However, there are more effective methods of accomplishing this. One method is to connect one end of a cable to the pipe at one location, and have the length of the cable wound on a rotating drum which is in turn mounted to a truck. The truck is then driven down the length of the pipeline for a few miles, with the half-cell being placed in the ground at various locations along the length of the pipeline.

When one realizes that pipelines extend beneath freeways, underneath rivers, underneath the ocean floor, and through other areas of difficult access, it can be seen that there are practical problems in employing the half-cell method. Nevertheless, the half-cell method has in a sense become the standard of the industry, and substantial work has been done in analyzing the data gathered through the half-cell method and correlating this to the condition of pipelines in the soil. The net effect is that there has been for many years a growing problem of substantial magnitude in effective detection of pipeline defects. In the United States alone, there is a vast network of pipelines extending along various routes, and there are conferences held between the various owners/operators of such pipelines to resolve the problems associated with these pipelines (e.g., the electrical field of one pipeline affecting another pipeline adversely). Also, the increasing sensitivity to environmental considerations associated with pipeline leaks is of greater concern. Further, the economic considerations of proper maintenance and functioning of these pipelines is significant.

Another prior art method of analyzing the condition of various objects is time domain reflectometry, where a pulse is transmitted along the length of the member being tested, and at the location of a discontinuity, there is a reflection of the pulse which is sent back to a receiving location (which can be the location at which the pulse was transmitted). By measuring the time increment from the transmission of the pulse to the time the reflection is received, while knowing the velocity of the pulse, the location of the discontinuity can be ascertained. Also, depending on the circumstances, the character of the reflected pulse may yield information about the nature of the discontinuity. While this method has value for certain applications, to the best knowledge of the applicant, this has not proven to be an effective method of analyzing the conditions of pipelines.

A search of the patent literature has disclosed a number of U.S. patents these being the following.

U.S. Pat. No. 4,755,742 (Agoston et al) describes a dual channel time domain reflectometer used to avoid multiple reflections of the test pulse.

U.S. Pat. No. 4,739,276 (Graube) also shows a time domain reflectometer which permits the examination of the magnitude of impedance faults along a cable.

U.S. Pat. No. 4,538,103 (Cappon) shows a time domain reflectometer for testing a cable in conjunction with an oscilloscope or other display apparatus. Positive and negative pulses are generated, and these are synchronized with one another. Both pulses are generated at one end of the cable by the same piece of equipment.

U.S. Pat. No. 4,291,204 (Crick) shows a system which can be used with a time domain reflectometer system. An arc is created to provide a low resistance from which the time domain reflectometry signal is reflected.

U.S. Pat. No. 4,289,019 (Claytor) shows a system for detecting leaks in buried pipes. There is provided a plurality of acoustic detectors associated with the pipe under test. The signals reaching the various pickups are compared and a location of the leak can be determined. In a second embodiment shown in FIG. 4, there are two pickups placed at the same section of the pipe, one to sense longitudinal waves and the other torsional waves. The two outputs are compared and a statistical analysis can be obtained as to the location of the leaks.

U.S. Pat. No. 3,600,674 (Roberts et al.) shows a system in which there is a data carrying cable buried below the pipeline that is to be tested. If the material carried by the pipe leaks, it affects the cable so as to produce conduction discontinuity anomalies in the cable. The discontinuities are in turn measured with a time domain reflectometer to determine the location of the leak. This requires burying the cable with the pipeline.

U.S. Pat. No. 2,887,652 (Bendayan et al.) discloses a system utilizing the principle of time domain reflectometry, this showing some of the earlier work in such systems.

U.S. Pat. No. 2,725,526 (Sringfield et al.) provides the means for determining a line fault by recording the initial surge that starts the fault and the reflected signals. By timing the arrival of various parts of the initial signal and the reflected signals, the location of the fault may be determined.

U.S. Pat. No. 2,602,834 (Leslie et al.) shows a device for locating faults in transmission lines, utilizing reflected wave technology for fault detection. There is a source of RF energy that is coupled to the line under test and a receiving system. The RF pulse is generated and sent down the line and if there is a fault in the line, a signal is reflected back. The nature and timing of the reflected signal is an indication of the fault and its location. This again depends upon the reflected signal to determine the fault.

U.S. Pat. No. 4,118,662 (Weber) shows a system for locating underground structures such as pipelines by the injection of a signal that is detected by equipment carried by an operator.

U.S. Pat. No. 4,063,161 (Pardis) shows a means for detection of faults in a cable by propagating a pulse into the cable and detecting the leakage point by profiling the ground potentials. Thus, it would not be possible to utilize this system effectively where the location of the fault is in an inaccessible area.

U.S. Pat. No. 3,924,179 (Dozier) discloses a means of finding a single "dead" wire in a cable bundle by observing the effect of a DC pulse being passed through the cable and detecting the generated field with a receiving instrument.

U.S. Pat. No. 2,113,749 (Statham) discloses a geophysical prospecting system where a series of signals are generated into the earth, and the propagation of the signals through the geophysical formations is determined.

SUMMARY OF THE INVENTION

The present invention incorporates further development work done in connection with the basic systems and methods described in U.S. Pat. No. 4,970,467, entitled "APPARATUS AND METHOD FOR PULSE PROPAGATION ANALYSIS OF A PIPELINE OR THE LIKE".

The method and system of the present invention are arranged to detect an anomaly along a member having a lengthwise axis. Within the broader scope of the present invention, this term anomaly is intended to be interpreted more broadly to include various changes in the physical condition of the member, or even effects of ambient conditions relative to the member (including ambient electrical conditions).

The system and method of the present invention are particularly well adapted to ascertain such anomalies along the length of a pipeline, such as an underground pipeline which transmits fuel. More particularly, it has been found that the present invention can provide data of conditions along the length of the pipeline which can be correlated with the data derived by standard prior art methods, such as the "half-cell" method which is the present standard in the industry.

It has also been demonstrated that the present invention can be used to ascertain other anomalies. For example, a change of material in the elongate member can be detected, and also a change in electrical conductivity. On the basis of experimental data so far, it is surmised that other physical conditions, such as change in physical structure of the member can also be detected.

In the method of the present invention, a first electrical pulse is sent from a first location on a lengthwise axis of the member, with this pulse traveling toward a second location on the axis. A second electrical pulse is sent from a second location on the axis toward the first location, with the second pulse being synchronized with the first pulse in a manner that there is an intersection of said first and second pulses at a first intersecting location along the axis.

At least one of the first and second pulses is detected and analyzed after passing through the intersecting location to ascertain modifications of said one of said pulses. In this manner, by correlating certain modifications in the pulse or pulses and also ascertaining the location of the intersection, the location of the region of the anomaly can be ascertained.

Desirably, a series of first and second pulses are transmitted, these being synchronized to cause the location of the intersection of the pulses to move to different intersecting locations.

Wave form variations between pulses can be compared to ascertain a region of possible anomaly and also its nature. Also amplitude variations between the pulses can be compared to ascertain the regions of anomaly, and the degree and severity of the anomaly.

In a particular embodiment, first and second pulses are transmitted through the member. The duration and amplitude of the pulses can vary, depending upon the length of the member and other factors, but it is expected that the duration of the pulses would be between zero to one microsecond.

The velocity of the pulses can be determined by measuring a time period during which a pulse is transmitted a predetermined distance along the axis. When the velocity of the pulse is known, the intersecting location can be moved predetermined increments of distance along the axis by changing synchronization of the pulses by time increments corresponding to distance of movement of the intersecting location along the axis.

In the system of the present invention, first and second transmitting means are provided to transmit the first and second pulses. Synchronizing means is provided to synchronize the pulses and also to step the point of intersection along the axis. There is also detecting and analyzing means operably connected to the member to receive at least one of the first and second pulses.

It has also been found that small defects, such as cut part-way into a coaxial cable can be detected and located by the present invention.

Further, it has been found that analyzing certain frequency variations in the wave form or fingerprint of the intersecting wave form can provide information as to anomalies along the member being tested, these being believed to result from changes in current density in the pipeline or other member which is being tested.

Another facet of the present invention is that a pipeline or other object which is beneath the earth's surface or possibly contained in some other manner can be analyzed by imposing a current (desirably a DC current) on the pipeline or other object for a period of time and then observing changes in electrical potential and/or current flow. One method is to observe changes in electrical potential over a long period of time (i.e. time periods for minutes, hours, or even days). This is desirably done in combination with the pulse propagation technique of the present invention, and it provides a valuable analytical tool to test a pipeline or other underground objects. Another analytical technique is to impose the direct current and then observe the change in the current flow along the length of the pipeline or other object. A rather large change in current flow in a relatively short distance would indicate possibly that a degradation of the pipeline or other object could occur at that location.

Other features of the present invention will be apparent from the following detailed description.

BRIEF DESCRIPTION OF THE DRAWINGS

FIGS. 10$m$, 11$m$, 12$m$ and 13$m$ are a second set of graphs showing wave forms produced in accordance with the experiments described in Example II, with a metal coupler joining the two pipe sections.

FIGS. 25 through 27 are graphs illustrating the strength of a current along the length of a pipeline when a DC voltage is imposed on a pipeline.

FIGS. 28 is a schematic drawing showing an apparatus for practicing the present invention, this apparatus being shown in my patent application being filed concurrently herewith and entitled "APPARATUS AND METHOD FOR PULSE PROPAGATION ANALYSIS OF A PIPELINE OR THE LIKE".

DESCRIPTION OF THE PREFERRED EMBODIMENTS

It is believed that a clearer understanding of the present invention will be achieved by first describing much of the subject matter of U.S. Pat. No. 4,970,467 (this patent hereby also being incorporated by reference, along with the other two patent applications cross references earlier). There will first be described in a rather simplified form the basic operation of the invention described in U.S. Pat. No. 4,970,467. This will be followed by a description of a series of tests to demonstrate the basic principles of the present invention. Finally, there will be described two systems by which the invention can be applied in a full scale commercial application, as in analyzing the integrity of an existing pipeline.

Figure 1:
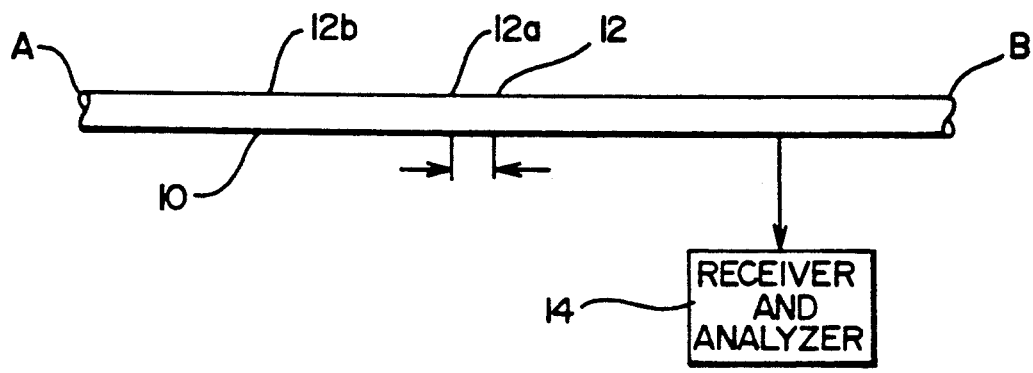
FIG. 1 is a somewhat schematic view illustrating a pipe and showing a simplified process of the present invention.

Reference is made to FIG. 1, where there is shown a length of steel pipe 10 having two end locations A and B. A first electrical pulse of short duration is imparted to the pipe 10 at location A, and at the same time a second electric pulse is imparted to the pipe at location B. On the assumption that the two pulses travel toward each other at the same rate of velocity (e.g., approximately one-half foot per nano-second), these two pulses will meet at a center location 12. It is to be expected that as these two pulses meet, they will interact with each other in some manner, with the modified pulse from point A traveling beyond the middle point of intersection at 12 toward a receiver and analyzer 14. In like manner, the pulse emitted from point B will travel beyond the intersection 12 toward point A. There may also be patterns of reflecting wave forms at various locations along the length of the pipe 10.

Let it now be assumed that the pulse at point A is delayed by two nano-seconds relative to the time at which the pulse at point B is initiated. In this situation, the pulse at point B gets a two nano second "headstart". In that two nano-second headstart interval, the pulse B (traveling at a rate of one half foot per nano-second) will have traveled one foot farther down the pipe 10 than pulse A, so that pulse A and pulse B will intersect at a location 12a which is one half foot closer to point A than the original point of intersection 12 which is equally distant between point A and point B. The pulse A will again be modified at the point of intersection and proceed on toward point B, and this modified pulse A will again be detected by the receiver and analyzer 14. In like manner, by adjusting the delays of the times at which the pulses are emitted from point A and point B, the points of intersection 12, 12a, etc. can be "stepped along" the length of the pipe 10 to any location between the points A and B.

It has been discovered that if there are certain anomalies (this term anomaly being used in a broad sense) at the point of intersection (e.g. 12 or 12a), the signature or wave form of the modified pulse after passing through the point of intersection will be different than it would be if this anomaly did not exist at the region of the intersection. It has further been discovered that this particular signature is not present if only a single pulse is generated to pass through the region of anomaly and then to be detected by the receiver and analyzer 14.

To explain this further, let it be assumed that there is a certain anomaly in the pipe at location 12b. Let it further be assumed that a pulse is emitted from point A, but no corresponding pulse is emitted from point B. The pulse from point A will travel through the region of anomaly at 12b and arrive at the receiver and analyzer 14, and the signature of this single pulse A is recorded. Let it now be assumed that the same pulse A is transmitted from point A, but there is no anomaly at region 12b, and this same pulse reaches the receiver and the analyzer 14, with its signature being recorded. Depending upon the nature of the sort of anomaly that might exist at 12b, the nature of the anomaly may or may not be ascertainable by analyzing the form of the pulse from A, and even if it is identified, it would be difficult to determine the location of such anomaly along the length of the pipe.

However, let us take the same situation as indicated above, and let us now assume that the pulses are emitted from both points A and B at spaced time intervals, so that the point of intersection is "stepped along" the pipe 10, as described above. It has been found that as the point of intersection is stepped along the pipe 10, a first signature pulse from point A passing through the point of intersection of pulses A and B will produce a certain signature at such time as the point of intersection is at an area of no anomaly. However, at such time as the point of intersection is in the region of the anomaly at 12b, then a different recognizable signature is given to the pulse A, and by comparing this modified signature with the previous signature, it can be recognized that an anomaly is present. Further, since the time interval between the transmitting of the pulses A and B can be accurately predetermined, it is then possible to recognize not only the presence of the anomaly at 12b, but also the location of the anomaly. In another sense, we can consider the pulses from points A and B intersecting to create an interference pattern. This interference pattern will have one signature when the intersecting location is at an area of no anomaly, and the intereference pattern will have a different signature when the intersecting location is at an area of anomaly.

To relate this invention more closely to the problems associated with pipelines, it has further been discovered that this method described above is able to detect the presence and location of anomalies along the length of underground pipe where the nature of the anomalies are changes in the electrical potential between the pipe and the adjacent ground location. Beyond that, it has been discovered that the detection of such anomalies in an underground pipe by the method of the present invention can be correlated to the measurements which would be obtained by the half-cell method described previously under "Background Art".

To truly appreciate the significance of the present invention relative to underground pipes, two things must be recognized. First with the present invention, there needs to be access to the pipe 10 at only three locations, Namely the two locations A and B at which the two pulses are imparted to the pipe 10, and also the location of the receiver and analyzer, which can be adjacent to either of the locations A and B. Normally, these points would be easily accessible on most any pipeline installation. Second, if the data obtained by the present invention can be correlated to data which would be developed by the half-cell method on that same length of pipe, this opens the doors to the immense amount of analysis and data available from the half-cell method, but without the necessity of doing all the physical work associated with the half-cell method.

To explain this yet further let us assume that the pipe 10 is an oil pipeline which is buried in the ground beneath a body of water, and that the locations A and B are pipeline locations on opposite sides of the body of water, with the location of the receiver and analyzer 14 being adjacent to the point B. By use of the present invention, the timing of the pulses emitted at A and B can be adjusted so that the points of intersection (i.e. 12, 12a, etc.) can be stepped along the entire length of the pipe 10 beneath the body of water. At the location where the point of pulse intersection (e.g. 12 or 12a) is in the region of the area of the anomaly location 12b, the signature of the pulse emitted from point A will be modified in a manner which will indicate the anomaly. By knowing the timing of the two pulss A and B, the location 12b will be known. Then further examination (and repair if needed) could be conducted at the location 12b without searching along the entire length of the pipeline for the anomaly.

EXAMPLE I

To demonstrate these principles further, the following experiment was conducted. Six sections of steel pipe, each being ten and a half feet long, were connected by steel couplers to make a pipe length of sixty-three feet. This pipe had a one-half inch inside diameter and approximately one-inch outside diameter. Each ten and a half foot sections of pipe was wrapped with a different type f insulating tape. More specifically, beginning with the first pipe section being indicated at 1, and the subsequent pipe sections in order being designated 2, 3, 4, 5 and 6, the type of tape which was used on each such section is listed below:
1. plastic wrapping tape
2. black cloth tape
3. 3M pipeline wrapping tape
4. glass fibre tape
5. standard duct tape
6. masking tape Further, one of the ten and a half foot pipe sections (i.e., section number 5 which was wrapped with standard tape) was deliberately wrapped rather poorly so that there were gaps between the helical windings of the tape, with the total gap area being approximately three percent to five percent of the total exterior surface of this ten and a half foot section of pipe. This was done to simulate a condition in a pipeline where portions of the insulating tape for the pipe would be damaged or deteriorated so that bare pipe was exposed to the ground. The remaining five pipe sections were wrapped so that their entire surface areas were covered.

This sixty-three foot section of pipe was buried in the soil at a depth of approximately 36 inches, with the soil being a rather uniform sandy soil. The six different wrappings of tape were used to produce different pipe-to-soil conditions so as to simulate the conditions which might be encountered in a longer length of pipe which would extend through different soil conditions.

Figure 2:
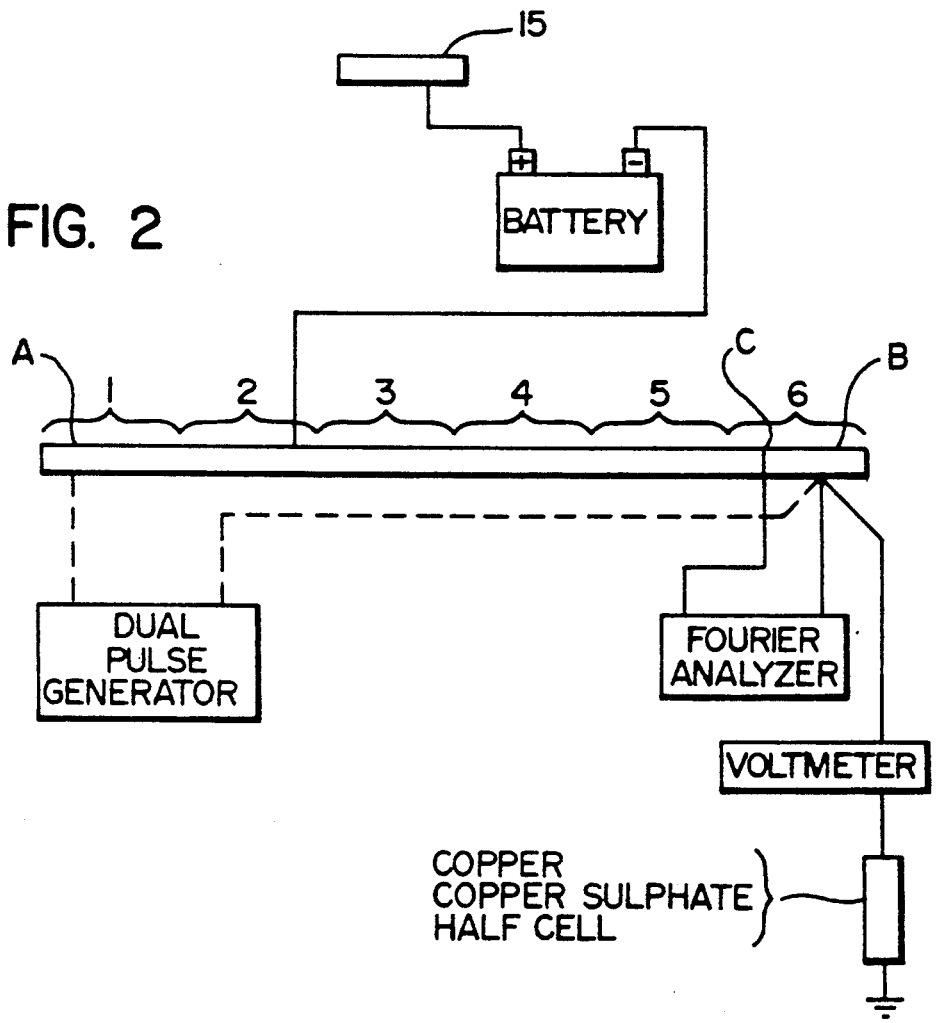
FIG. 2 is a view similar to FIG. 1, showing somewhat schematically a test set up used in accomplishing the experiments outlined in Example I described in this application.

Electrically conducting cables were connected at locations three and one half feet in from the opposite ends of each pipe, indicated at A and B in FIG. 2. A programmable dual pulse generator, number 8161A manufactured by Hewlett Packard was attached to the free ends of the two cables, the opposite ends of which were attached to points A and B of the 63 foot length of pipe, respectively, so that points A and B were 56 feet apart. In this particular test setup, the cable which was attached to point B was, for convenience, extended along the trench to the location of point A, and then both the cables were positioned adjacent to one another and connected to the programmable dual pulse generator. Thus, the cable extending to point B was about 56 feet longer than the cable extending from point A. In the actual experiment which will be described below, to synchronize the pulses, this difference in cable length was taken into consideration so that the points of intersection of the pulses were properly stepped along the length of the 63 foot pipe.

To receive and analyze the pulses, a Fourier Analyzer was connected to the pipes at point C, which was spaced from point B about five feet toward point A. Channel 1 of the Fourier Analyzer was attached to point C, while channel 2 of the Fourier Analyzer was attached to point B. In the latter phase of this experiment a digital oscilloscope (No. 2430A made by Tektronics) was substituted for the Fourier Analyzer.

To impart a DC voltage to the 63 foot length of pipe, the negative terminal of a six volt battery charger was connected directly to the pipe 15 at 40 feet from point B, and the positive terminal of the battery was connected to an anode, with this anode being a twelve foot section of 2½ inch inside diameter steel pipe which was buried in the soil to a depth of about three feet at a location fifty feet away from the pipe 15.

Figure 3:
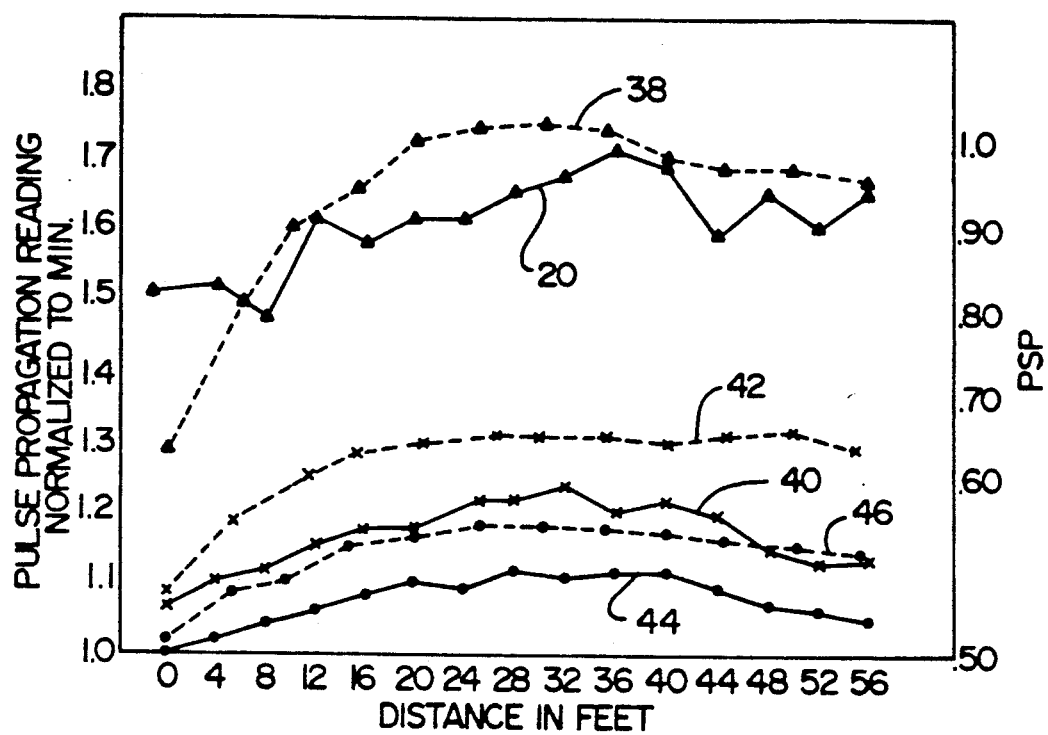
FIG. 3 is a graph illustrating readings taken along the length of a pipe using the half-cell method, and also utilizing the method of the present invention.

Next, a series of half-cell readings were taken along the length of the pipe at regularly spaced intervals which were about one foot from each other. This was done by manually moving the half-cell to ground locations immediately above the pipe, and then sticking the half-cell in the ground to a depth of about one inch. Then a volt-meter which was connected between the half-cell and point B on the pipe was read to obtain a pipe-to-soil-potential (PSP) at each location. The result of these half-cell readings are shown in the graph of FIG. 3, by the solid line identified at 20. The X axis extending along the bottom of the graph represents the location in feet along the length of the pipe at which the readings were taken. The Y axis which appears on the right of the graph at FIG. 3 represents the pipe-to-soil-potential (i.e. the pipe potential relative to the ground) and for purposes of illustration, these values have been normalized so that the numeral 1 represents the highest voltage reading taken while zero would represent no voltage. Actually the maximum ground potential that was measured was close to three volts.

Next, the method of the present invention was utilized to determine if there would be a correlation between the values obtained by the half-cell readings and those obtained by the present invention. Pulses of twenty nano second duration were imparted to points A and B at accurately timed intervals so that the points of intersection could be "stepped along" the length of pipe as described previously herein.

The pulse emitted from point A was a negative pulse of three volts, while the pulse emitted from point B was a positive pulse of three volts.

It should be pointed out that to obtain a reading at a point of intersection along the pipe, only a single pulse was emitted at point A and a second single pulse emitted from point B, with these pulses being synchronized very accurately so that the point of intersection could be ascertained within a tolerance of about one quarter of an inch. Then after a period of 0.25 seconds, a second pair of pulses were imparted to the pipe at points A and B, with the pulses being synchronized so that the point of intersection was stepped along the length of the pipe at an interval of about twenty four inches. The signature of each of these pulses as received at point C was analyzed to see what meaningful information could be gathered.

To describe the sort of wave forms which were recorded by the Fourier Analyzer and later by the oscilloscope, reference is made first to FIG. 4 where the voltage is plotted along the vertical Y axis and time is plotted along the horizontal X axis. It can be seen that at point 30, there is a very abrupt positive voltage spike. This represents the time at which the positive pulse emitted from point B passes point C which is the receiving location. After producing the spike at point 30, the pulse from point B proceeds along the length of the pipe toward point A and meets the negative pulse from point A at a point of intersection so that the two pulses from points A and B interact in some manner. The pulse emitted from point A after passing through the point of intersection with the pulse from point B then arrives at the sensing location C. In this particular graph, the point indicted at 32 represents the time at which the leading edge of the pulse emitted from point A reaches the sensing location C. A short increment of time later, there is a lower peak value indicated at location 34 on the graph of FIG. 4. The amplitude (i.e. voltage difference) between the points 32 and 34 was measured, and this was found to be minus 105 millivolts.

Figure 4:
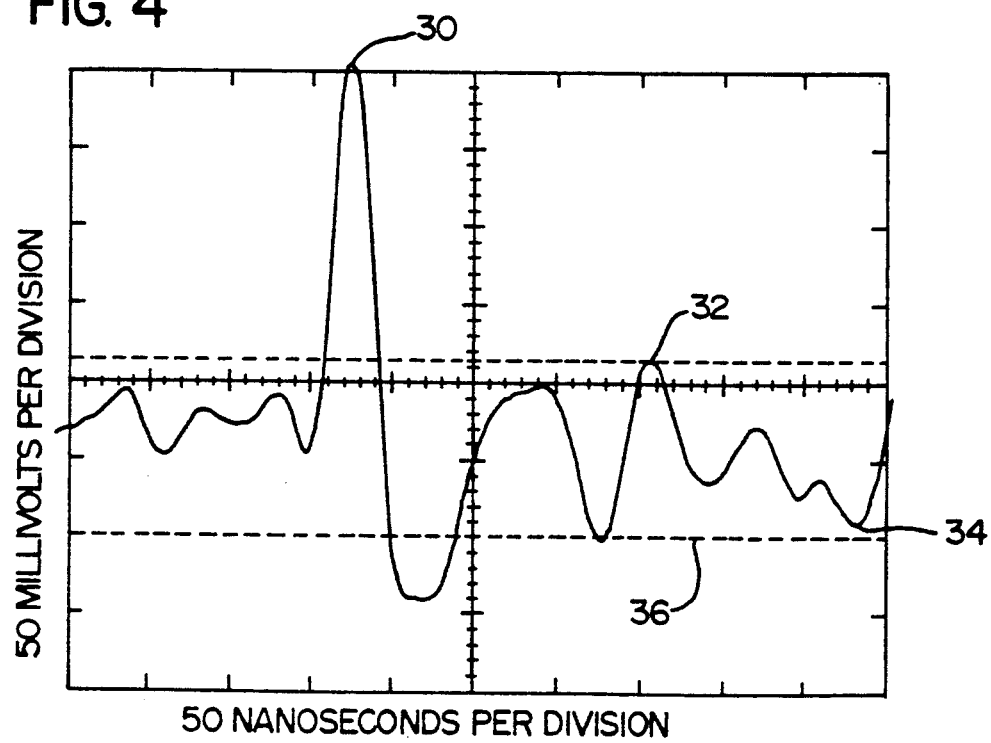
FIGS. 4 and 5 are graphs illustrating wave forms produced in the process of the present invention performed in accordance with Example I.

It should be pointed out that there are likely a number of influences causing the wave form shown in the graph of FIG. 4, such as reflected waves because of various conditions, etc.

Figure 5:
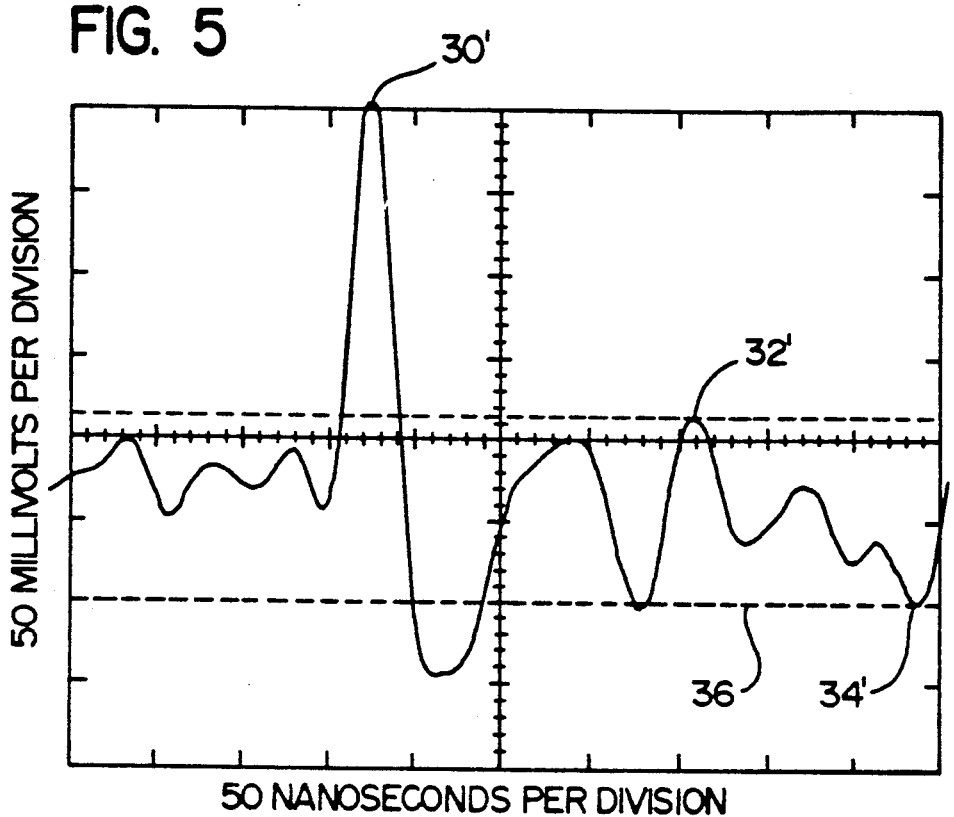

Next, attention is directed to the graph of FIG. 5, and this is essentially the same type of graph as shown in FIG. 4, except that the point of intersection of the two pulses emitted from points A and B has been moved. There is the point 30' at which the pulse at point B passes the sensing location C, and there are also the second two points 32' and 34', which correspond to the points 32 and 34 on the graph at FIG. 4. For purposes of comparison, a lower dotted line 36 is drawn at the graph of FIG. 5 to indicate the voltage level at point 34', and this same line 36 is drawn on the graph of FIG. 4. It can be seen that the amplitude between the points 32' and 34' is moderately greater than the amplitude of the corresponding points 32 and 34 on the graph at FIG. 4. The voltage difference between the points 32' and 34' is 112 millivolts (as seen in FIG. 5) as compared with a 105 millivolts as seen in FIG. 4. It should be noted that the pipe-to-soil-potential at the locations corresponding to those of FIGS. 4 and 5 were 1.29 and 1.21, respectively. The ratio of 105 millivolts to 112 millivolts (0.9375) is nearly the same as the ratio of 1.21 volts to 1.29 volts (0.9380), which gives further confirmation that the readings obtained by the present invention correspond to the pipe-to-soil-potential readings.

It is to be understood that the graphs at FIG. 4 and FIG. 5 simply represent the signatures of two different pulses having different points of intersection along the length of the 63 foot pipe. In continuing the experiment, the points of intersection of the pulses emitted from points A and B were stepped along the entire length of the pipe by properly synchronizing the pulses emitted from points A and B. The readings were taken from each graph (such as those shown at FIGS. 4 and 5), and specifically the amplitude values were measured (as indicated above between the points 32 and 34 of the graph at FIG. 4 and the points 32' and 34' from the graph of FIG. 5. The results were also plotted and are indicated by the broken line at 38 in the graph of FIG. 3. The values for the amplitude of the signal in FIG. 3 are plotted along the left vertical line of the graph, and these also have been normalized to present the inverse of the values between the highest and lowest amplitude. This was done so that the correlation between the half-cell readings and those of the method of the present invention can be viewed on the graph of FIG. 3.

Also in the graph of FIG. 3, there is shown a second solid line 40 which represents the readings taken by the half-cell method with the DC voltage being imparted to the 63 foot pipe being about three volts instead of the 6 volts which was applied to obtain the readings shown in the lines 38 and 20. The readings taken from the method of the present invention are indicated at the broken line of graph 42.

Yet another set of readings was obtained under circumstances where the DC voltage applied to the pipe was about two volts, with the solid line 44 representing the half-cell readings, and the broken line 46 representing the readings taken by the intersecting pulse method of the present invention.

Figure 6:
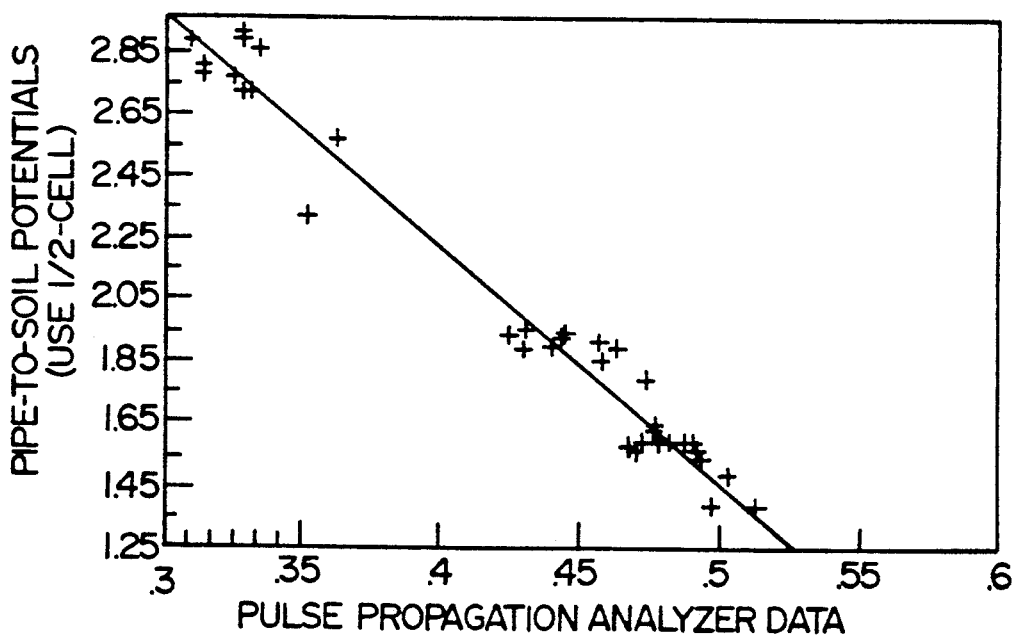
FIG. 6 is a graph by which the values obtained in the graph of FIG. 3 are shown in relation to a correlation curve.
Figure 7:
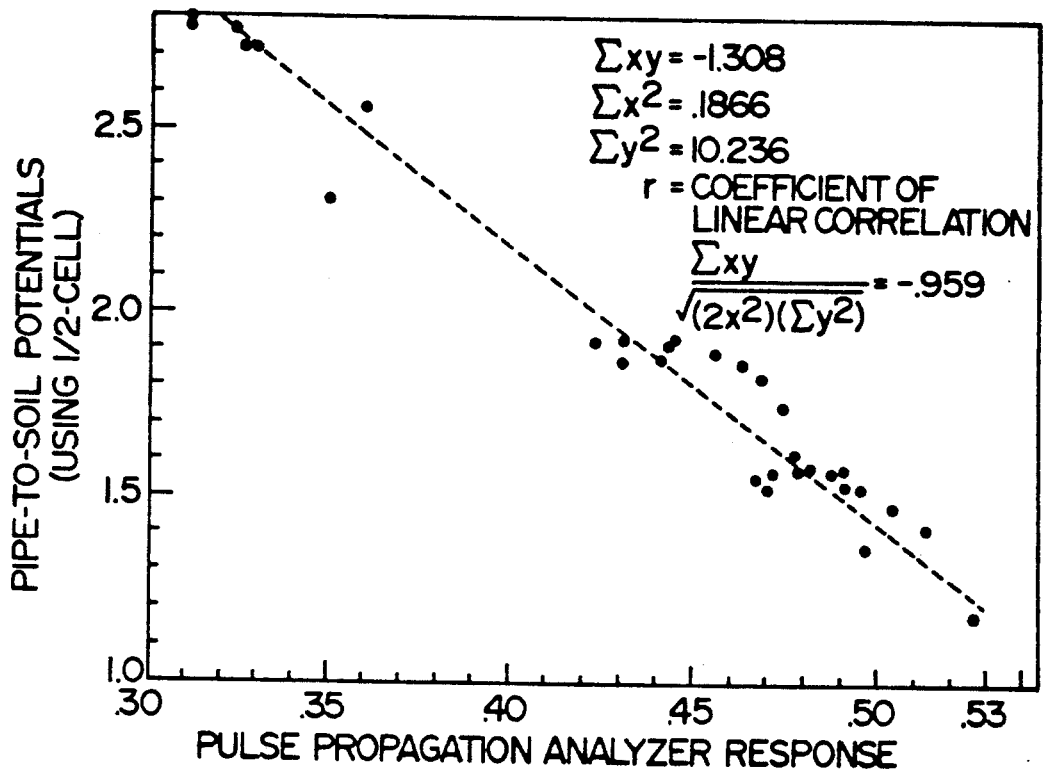
FIG. 7 is a graph similar to FIG. 6 showing these values in a correlation curve.

The correlation between the two sets of values is evident from viewing the graphs of FIG. 3. To further demonstrate this correlation, reference is made to FIG. 6. Along the vertical y axis, there are negative pipe-to-soil-potentials as measured by the half-cell at various locations along the length of the pipe. Along the horizontal X axis there are the values of the amplitude of that portion of the signature of the signal derived by the process of the present invention (i.e. the amplitude between points 32 and 34, 32' and 34' etc.). The diagonal line which is shown in FIG. 6 is a statistical "best fit" curve which was drawn by a computer to correlate the data points which are illustrated in that draft. FIG. 7 is a graph showing substantially the same information as the graph of FIG. 6, except that there is shown in addition the formula for obtaining the correlation coefficient. It can be seen that a correlation coefficient of 0.959 was obtained. (A correlation coefficient of one would show perfect correlation, while a correlation coefficient of zero would show no correlation.)

To recognize the significance of what is demonstrated by the experiments described under "Example 1" it bears repeating what was stated earlier herein, namely that being able to correlate the readings obtained by the methods of the present invention with readings which are obtained by the half-cell method opens the door to vast amounts of data and information derived therefrom as to the condition of a pipe line. For example, if one skilled in this industry is able to view half-cell data along the length of a pipe line, that person will be able to interpret that information in view of the vast amount of background information that is available regarding half-cell readings, and then draw certain conclusions about the conditions along various portions of that pipe line. With the present invention, the person is able to take the readings by the method of the present invention and obtain a set of data, and from this set of data ascertain within reasonable tolerances what the half-cell readings would be along that same length of pipe. However, it is to be recognized that further analysis obtained by the present invention may well lead to additional information which would not be available by the half-cell method.

As indicated above, in order to obtain some correlation of the data obtained by the present invention with the half-cell data, a certain section of the pulse signature was analyzed (as described previously herein with reference to FIGS. 4 and 5) and an amplitude value was obtained. Beyond this, it is contemplated that as more data is accumulated, the pulse signatures obtained under various conditions can be catalogued and compared, and yet further relationships may be ascertainable. Thus, it is to be recognized that the value of the method of the present invention is not intended to be limited to the particular analysis as described herein with reference to FIGS. 4 and 5.

EXAMPLE II

In Example I, it was demonstrated that the method of the present invention could be utilized to determine anomalies or variations along the length of a pipe line that correspond to the ground potential readings as taken by the half-cell method. To demonstrate that other types of anomalies could also be ascertained, the following set of experiments was performed.

Figure 8:
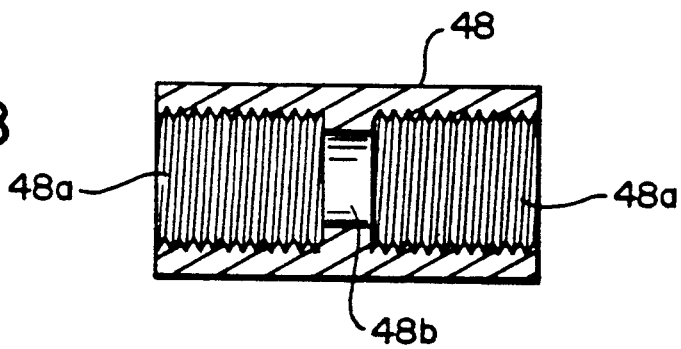
FIG. 8 is a longitudinal sectional view of a coupler used in conjunction with experiments performed as described in Example II herein.

A twenty one foot length of steel pipe was cut in half to make two 10 and ½ foot pipe sections 47 and these were first joined by a metal coupler 48 as shown in FIG. 8. This metal coupler had a cylindrical configuration with two sets of interior threads 48a formed at the end portions. There was an annular inwardly radially extending flange 48b to act as a stop member between the two pieces of pipe. The two ends of the pipe were formed with threads and then threaded into the ends of the coupler 48 so that the pipe ends were about ⅛th of an inch apart. The two ends of the pipe were supported above the ground on two insulating support members 47c, respectfully, made of styrofoam, and a series of tests were run by imparting pulses to the opposite ends of the pipe in generally the same manner as described in example I. This test set up is shown schematically in FIG. 9. Then these same two sections of pipe were joined together by a plastic coupler, having the same configuration as the metal coupler of FIG. 8, and a second set of tests were run.

Figure 9:
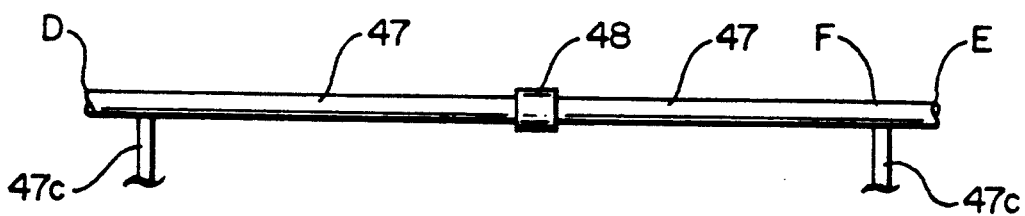
FIG. 9 is somewhat schematic showing of the test set up utilized in the experiments described in Example II of the present invention.

As with Example I, a programmable dual pulse generator, number 8161A manufactured by Hewlett Packard was attached to the free ends of two electrically conductive cables the other ends of the two cables were attached to opposite ends of the 21 foot pipe. In this instance, the duration of the pulses was 5 nano seconds, with a negative three volt pulse being imparted to point D, as shown in FIG. 9, and a second pulse being imparted at point E at the opposite end of the 21 foot pipe length. In this instance, the point F at which the receiver and analyzer was connected was one foot from point E. The receiving and analyzing unit used in this second experiment was a digital oscilloscope manufactured by Tektronics, number 2430A. The two cables that were connected from the ends of the pipe to the dual pulse generator were of equal length.

Figure 10A:
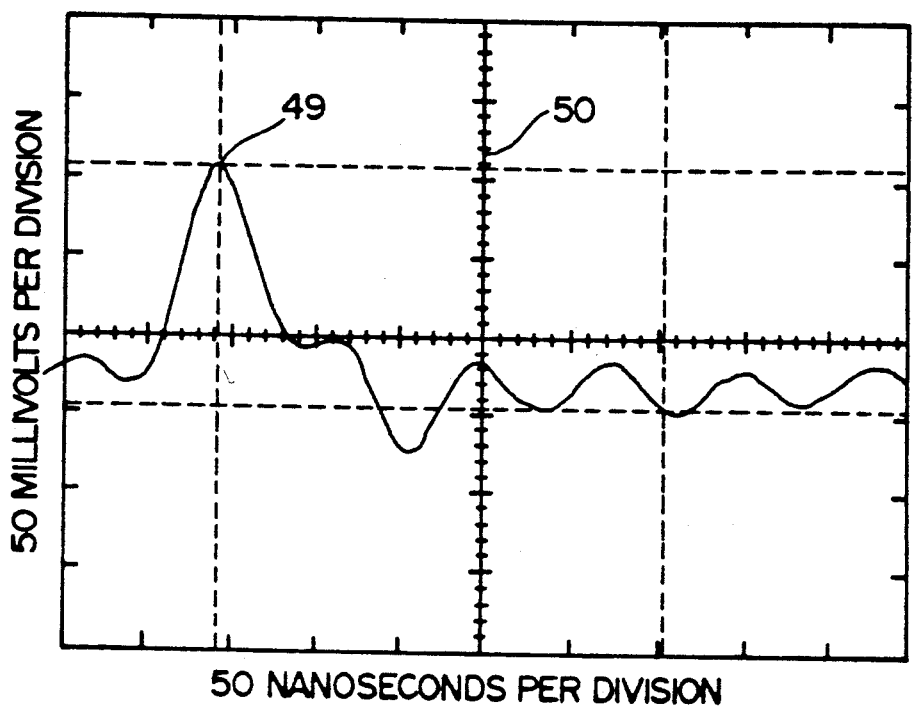
FIGS. 10$p$, 11$p$, 12$p$ and 13$p$ are a series of graphs illustrating the wave forms performed in the experiments described in Example II herein, where a plastic coupler was used to connect the two pipe sections.
Figure 10B:
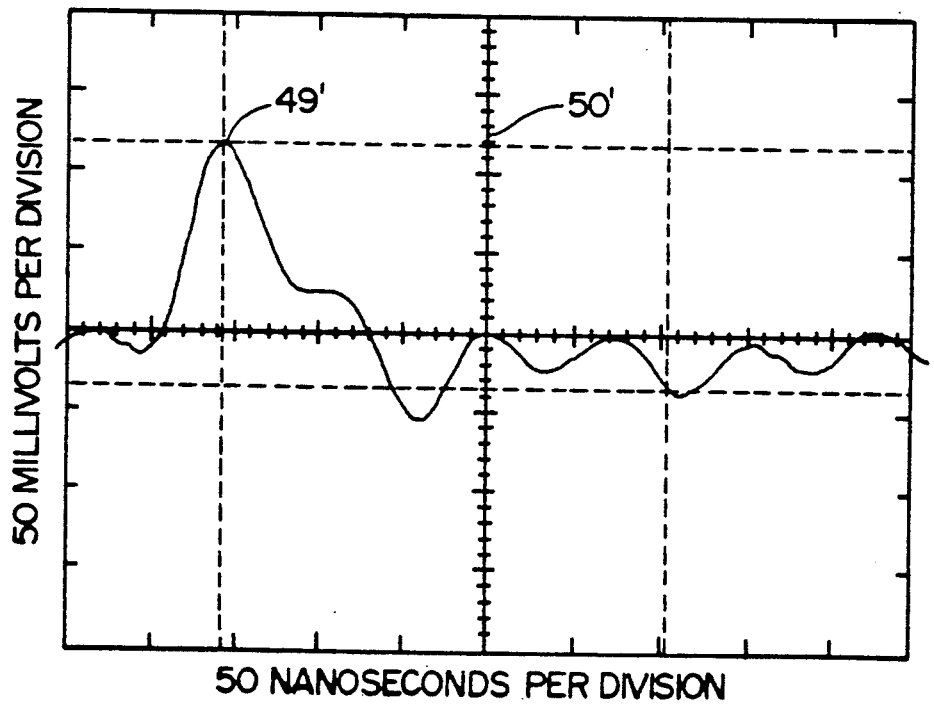

A first test was run by imparting a negative pulse to the pipe at point E, but with no synchronized pulse being imparted to point D. This was done first with the metal coupler 48 joining the two lengths of 10½ foot pipe, and then with the plastic coupler joining these same two lengths of pipe. FIG. 10m illustrates the wave form obtained with the metal coupler. The point 49 represents the time at which the pulse traveling from point E passes point F, and it can been seen that the receiver and analyzer records the voltage spike at point 49. The line at 50 represents the time at which the pulse emitted from point E would have passed point F, traveled to the center of the pipe where the metal coupler 48 was located, and then have reflected wave reach point F.

Then the very same procedure was followed as in the paragraph described above, except that a plastic coupler having the same configuration as the metal coupler 48 was used to joint the two lengths of pipe 47. Again, a single pulse was emitted at point E, with the point 49' representing the location at which the initial pulse passes the detecting location F, and with the line 50' indicating the time at which the reflected pulse wave would come back to the detection location F. The wave signature is shown in FIG. 10p. It can be seen that there is no significant change in the pulse wave signature from that shown in FIG. 10m.

These two initial tests of sending the single pulse and then detecting any reflection would represent results that might be obtained if it were attempted to use time domain reflectometry. The similarity of the wave form of FIGS. 10m and at 10p indicates the difficulty of obtaining meaningful information by time domain reflectometry in this particular test set up.

Figure 11A:
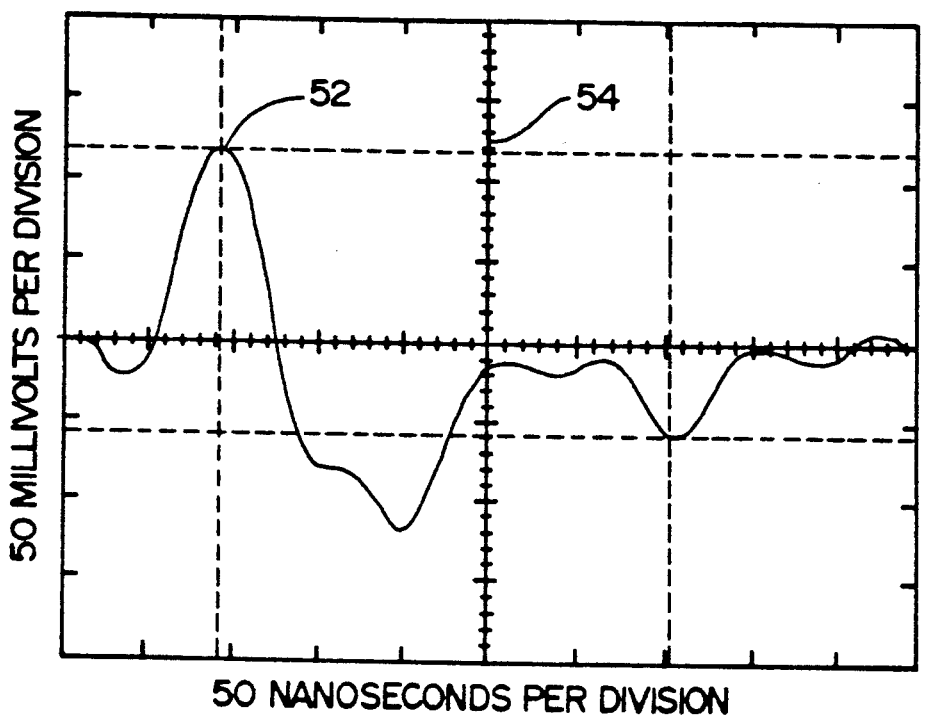
Figure 11B:
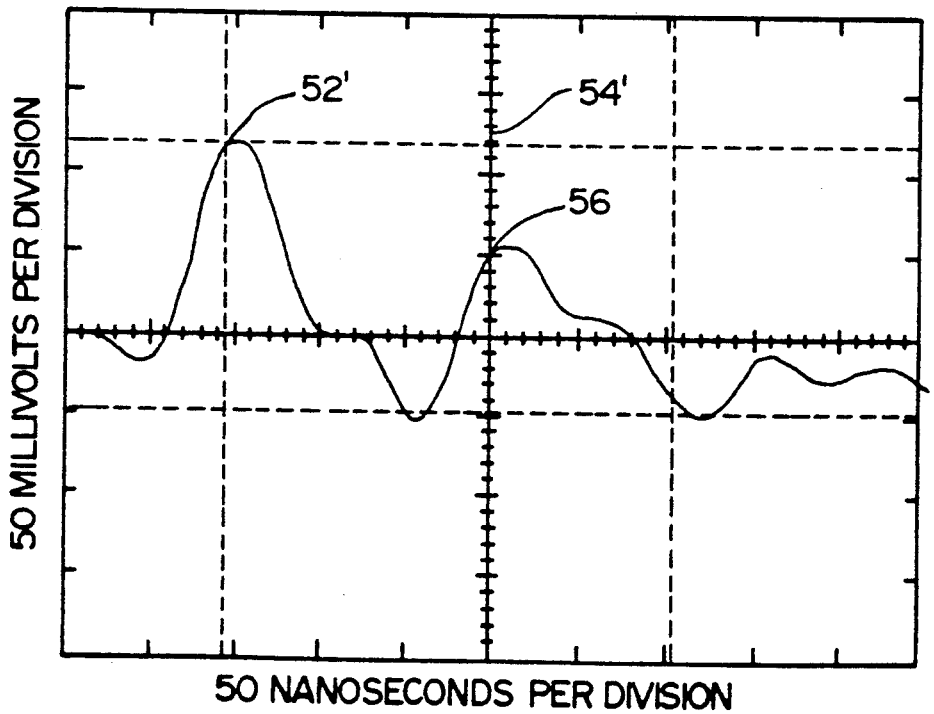

Then a second set of experiments was run. The test conditions were identical to those used to obtain the data for FIGS. 10m and 10p, except that this time a positive pulse of five nano seconds duration and plus three volts was emitted from point E, while a negative three volt, five nano second pulse was emitted from point D, with these being synchronized so that the point of intersection was stepped along the length of the pipe. FIG. 11m represents the wave form which resulted when the metal coupler was used. It can be seen that point 52 is the peak at which the pulse from point E passed the sensing location F. The line at 54 represents the location at which the pulse emitted from point D reaches the sensing location at point F. The timing of the pulse from points D and E were such that the point of intersection was at the middle of the pipe (i.e. at the location of the metal coupler 48.)

Reference is now made to FIG. 11p, where the very same procedure was followed as was done with respect to FIG. 11m, except that the plastic coupler was used to join the two lengths of pipe 47. Point 52' represents the spike of the pulse emitted from point E passing the sensing location F, and the line at 54' indicates the location where the pulse from point D reaches the sensing location F. The point of intersection of the two pulses was as the location of the plastic coupler. It can be seen that there is very definite peak at 56 in the wave form shown in FIG. 11p which is not present in the graph of FIG. 11m. Thus, it becomes apparent that the mere substitution of the plastic coupler for the metal coupler produces a rather different wave signature. It should also be recalled that, with reference to FIGS. 10p and 10m, where the single pulse was emitted from point E (but no synchronized pulse from point D), there was not the significant difference in the wave form when the plastic coupler was substituted for the metal coupler. Thus, although the physical and electrical differences between plastic and metal couplers are obvious, the single pulse reflectometry tests showed no obvious differences. However the present invention clearly discriminates between the two anomalies.

Figure 12A:
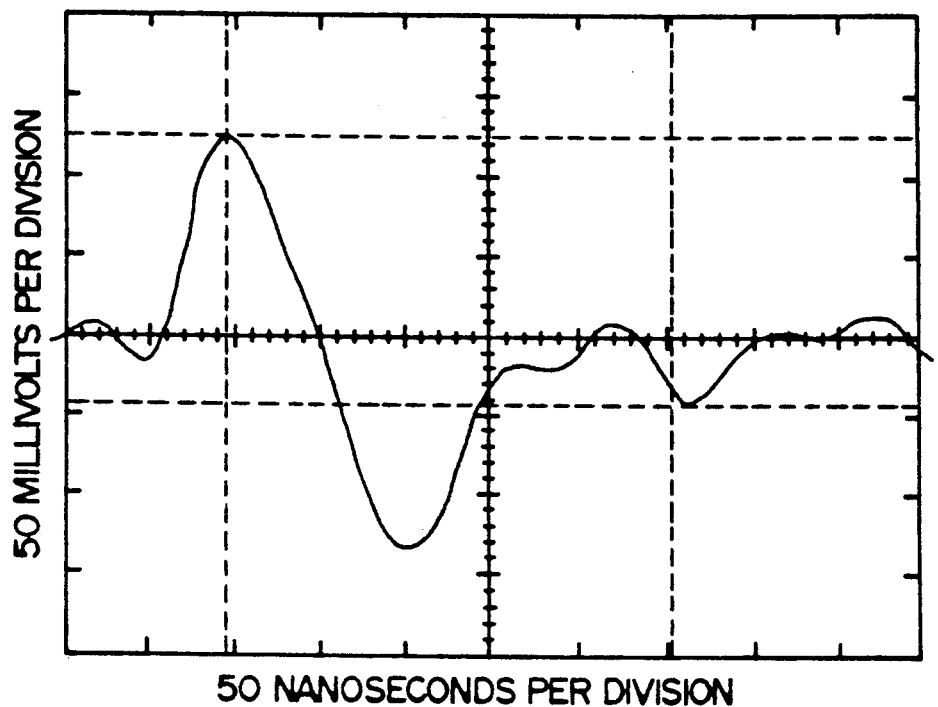
Figure 12B:
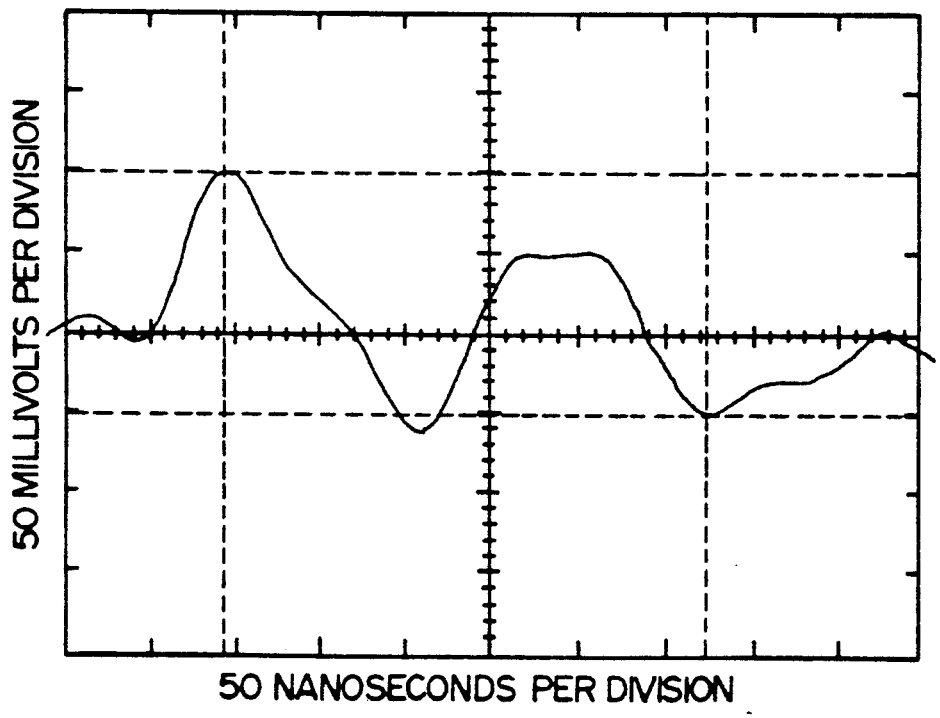

FIG. 12m represents the wave form which was obtained by conducting substantially the same experiment as described with reference to FIG. 11m, except that the pulse at the location E was initiated at location E ten nano seconds earlier than the pulse at location D was initiated, so that the intersection of the two pulses was about two and one half feet from the location of the coupler 48 toward point D. Then the same procedure was followed except that a plastic coupler was connecting the pipes, and the wave form is shown at FIG. 12p. It can be seen that the wave form of FIG. 12p is significantly different than the wave form of FIG. 12m, and also that the wave form of 12p is definitely modified from the wave form shown at 11p. Thus, it is apparent that the signatures of these wave forms not only differentiates between the metal coupler and the plastic coupler, but also indicates a different location of intersection, relative to the location of the coupler.

Figure 13A:
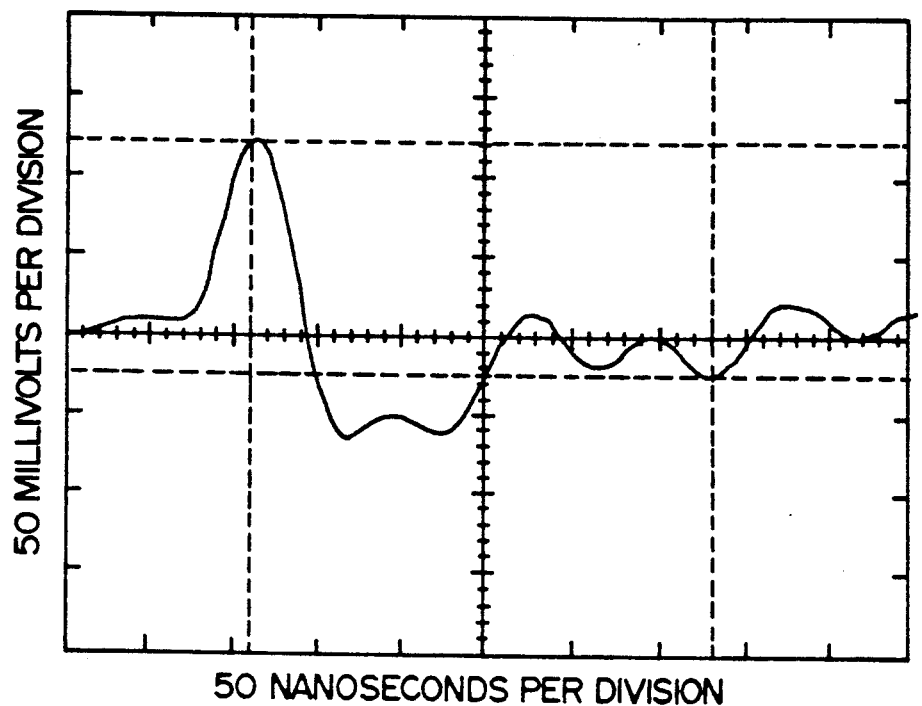
Figure 13B:
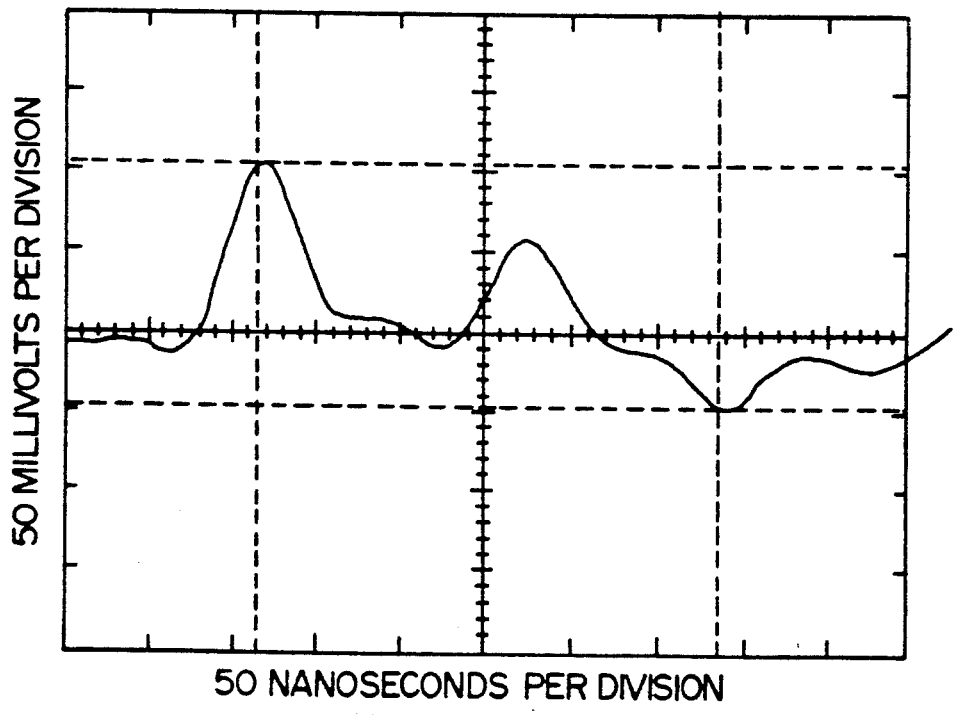

With reference to FIG. 13m, the same procedure was followed as described above, with reference to FIGS. 12m and 12p, except that in this instance the pulse was imparted to Point D ten nano seconds earlier than the pulse imparted at point E, so that the intersection would be approximately two and one half feet from the middle of the pipe toward point E. FIG. 13m shows the wave form derived with the metal coupler, while FIG. 13p shows the wave form derived from a plastic coupler. The differences in the wave forms of the graphs at FIGS. 13m and 13p are apparent, and also the differences between the wave form of FIG. 13p and FIGS. 10p, 11p, and 12p are apparent.

The set of experiments described above, "Example II", illustrates that the method of the present invention clearly shows different signatures of the wave forms which depend not only on the material of a coupler but also on the location of the coupler relative to the location of intersection of the pulses. Further, the differences in electrical conductivity at various locations can be detected. This also demonstrates that these significant differences do not occur when using a method that would depend upon the physical phenomenon of time domain reflectometry.

Examples I and II given above were also presented in U.S. Pat. No. 4,970,467. The following examples contain subject matter not disclosed in U.S. Pat. No. 4,970,467. As a general comment, it has been found that the present invention can be practiced by having the intersecting pulses be both positive pulses, both negative pulses, or one pulse being positive or one pulse being negative. There are other discoveries which will be discussed below.

EXAMPLE III

An RG 58 Coaxial cable used in the testing had been damaged earlier by a lawnmower running over it, and it was later repaired. The length of this cable about 250 feet.

Pulse generators were connected to opposite ends of the cable and pulses of about 200 nanoseconds and four volts were transmitted into the cable and stepped along the length of the cable.

Figure 15:
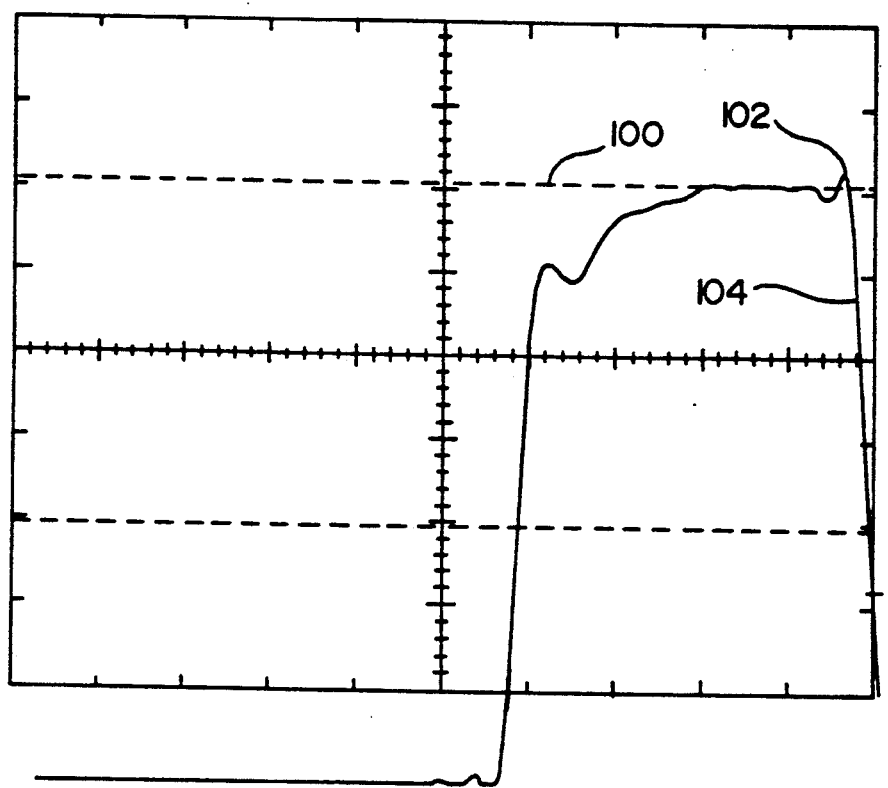
FIGS. 15 through 18 display graphs of wave forms resulting from propagating intersecting waves along the length of a cable, and detecting a defect at one location of the cable.
Figure 16:
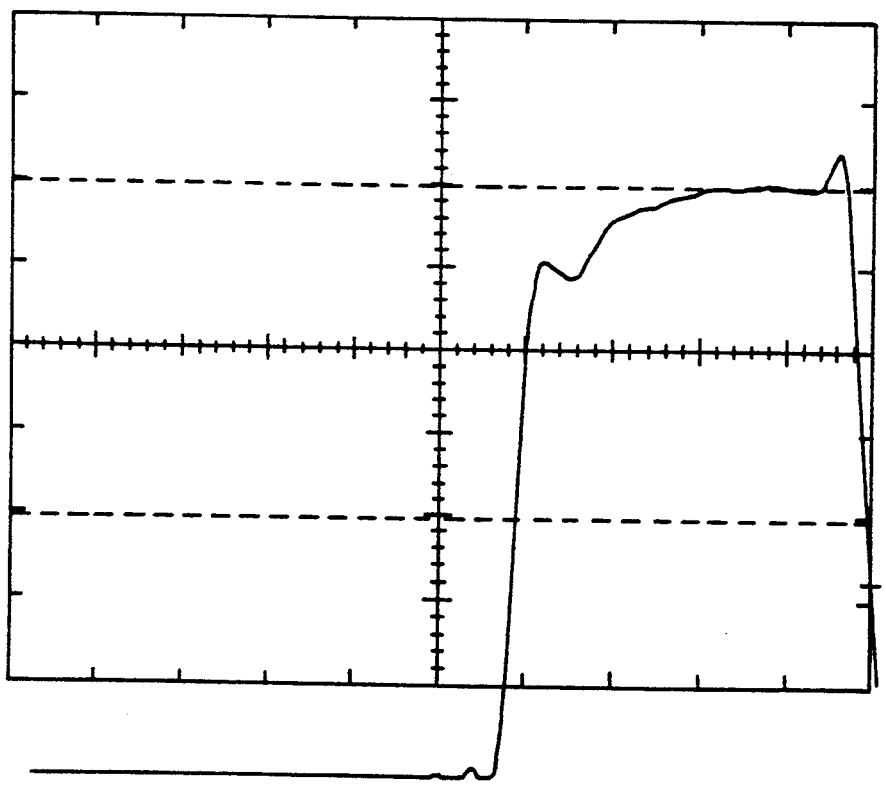

FIG. 15 shows the wave form fingerprint at a point of intersection along this section of cable which was undamaged. It will be noted that at the leading edge of the pulse wave form (appearing at the left of the graph) there is an abrupt rise in voltage, after which the voltage raises to a level indicated at the dotted line 100. Thereafter, the voltage remains at the same level, until at the very end of the wave form there is a small upward blip at 102. Thereafter, the wave form drops sharply to a lower level, as indicated by the line portion 104 of the wave form of FIG. 15. This particular pattern was repeated substantially as shown in FIG. 15 along the length of the cable, and a typical wave form similar to that shown in FIG. 15 is also shown at FIG. 16, this being at another typical location long the length of the cable.

Figure 17:
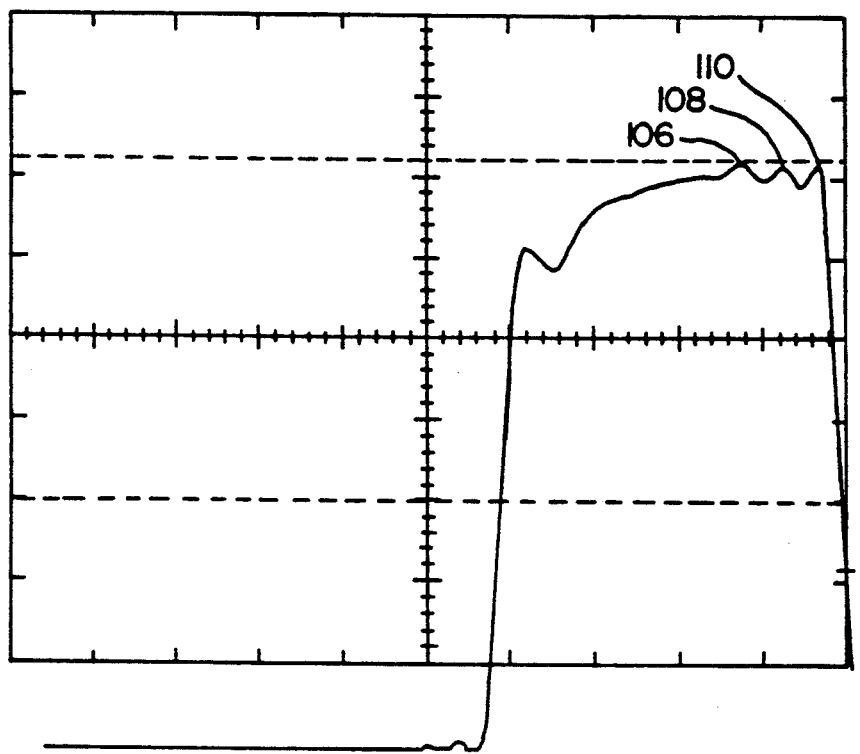
Figure 18:
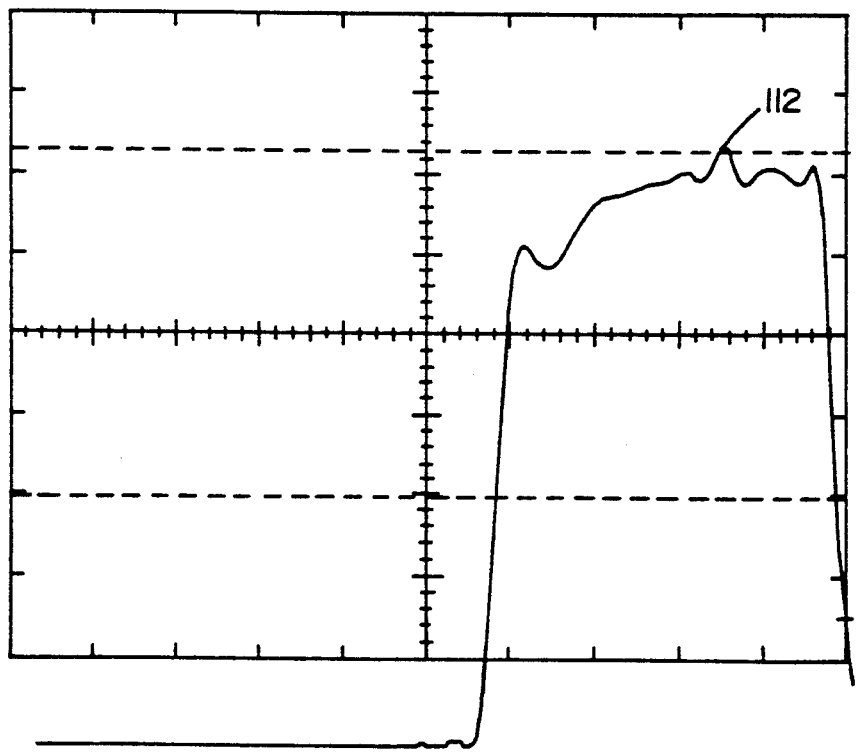

However, as the point of intersection was stepped along the cable, an aberration in the wave form was noted, and this is indicated in FIG. 17. It will be noted in FIG. 17 that in addition to the final blip, as shown at 102 in FIG. 15, there are two earlier blips 106 and 108 appearing before the final corresponding blip 110 shown in FIG. 17. Then the point of intersection was stepped further along the cable to a location where the wave form at the point of intersection is shown at FIG. 18. It will be noted in FIG. 18 that there is a peak blip 112 that appears in the latter half of the wave form, at a location approximately between sixty percent to eighty percent of the wave form (with zero percent being at the start of the wave form and one hundred percent being at the end of the wave form). The particular location of the pulse intersection was calculated, and then the cable was inspected at the location where the pulse intersection took place on the cable as shown in FIG. 18. It was found that at the point where the intersection of the pulse first occurred, there was in fact a cut in the cable. This cut extended through the outer cover and into the cable a short distance, which was estimated to be about 10% to 25% of the total diameter of the cable.

It is of interest to note that with the length of the pulses being about 200 nanoseconds, the actual physical length of the pulse would be possibly as high as one hundred fifty feet. Nevertheless, this cable defect which was only about 0.25 of an inch in axial length appeared as an anomaly (specifically a blip) on the wave form.

EXAMPLE IV

An analysis was being performed on a length of underground pipeline having an outside diameter of 6 inches, and with the pipeline section being tested having a length of 425 feet.

Figure 19:
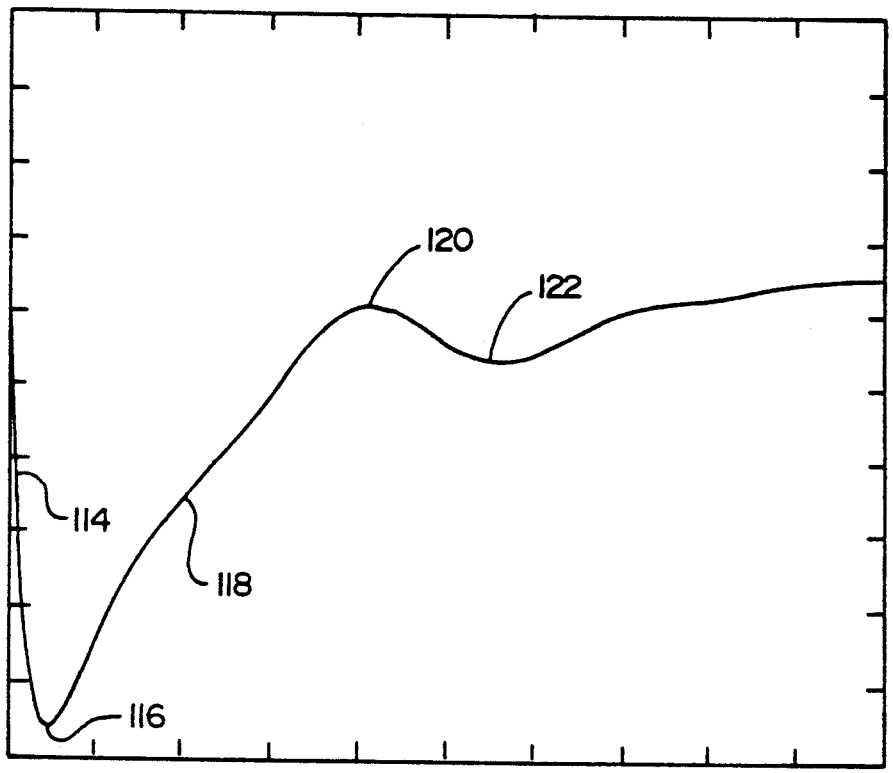
FIGS. 19 and 20 are two graphs illustrating wave forms where frequency changes were observed as indicating an area of a possible anomaly, which may relate to a change in electrical current density at a location.
Figure 19A:
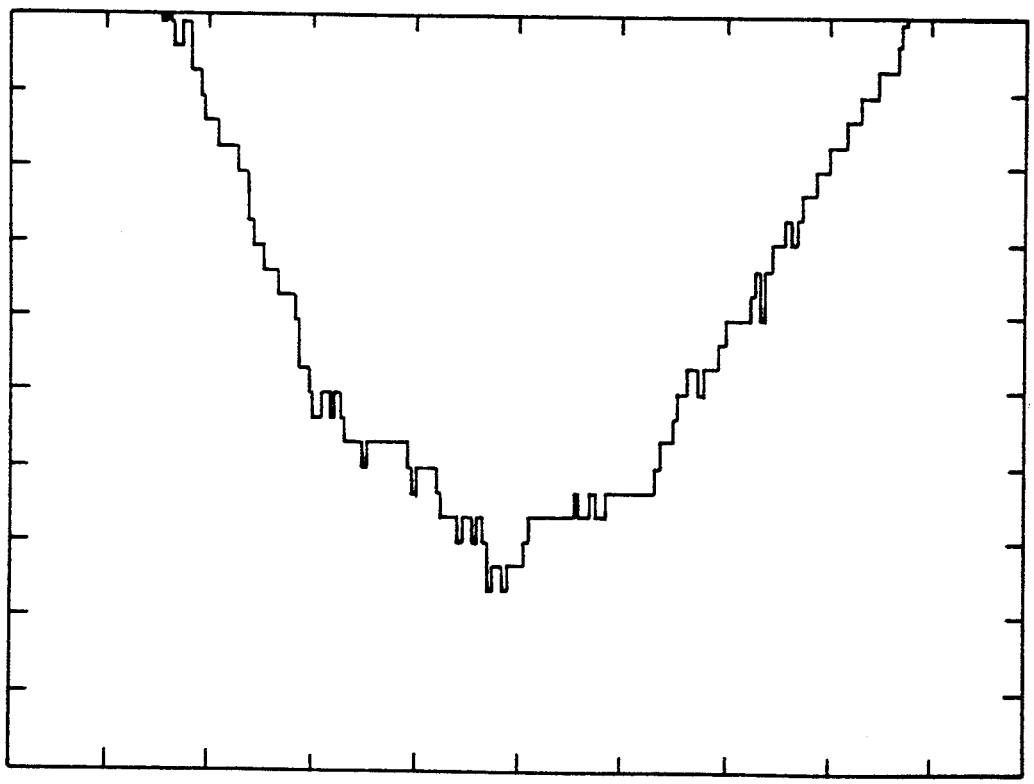
FIG. 19A is a graph showing a portion of the wave form of FIG. 19 drawn to an enlarged scale, this wave form being located between the fifth and sixth horizontal markings on the graph of FIG. 19.
Figure 20:
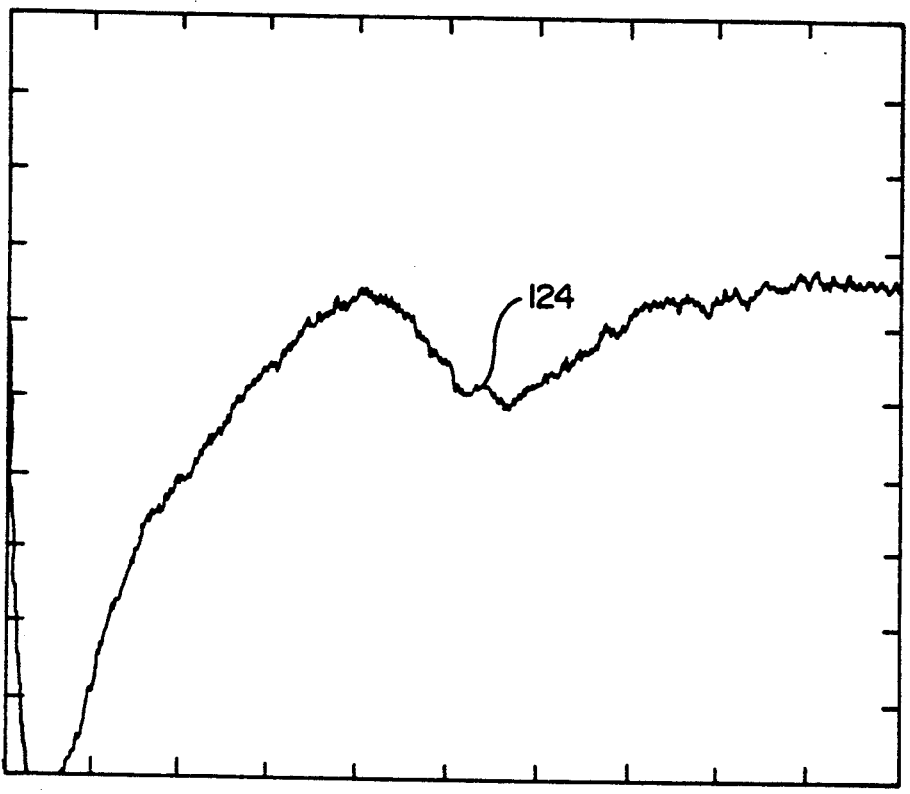
Figure 20A:
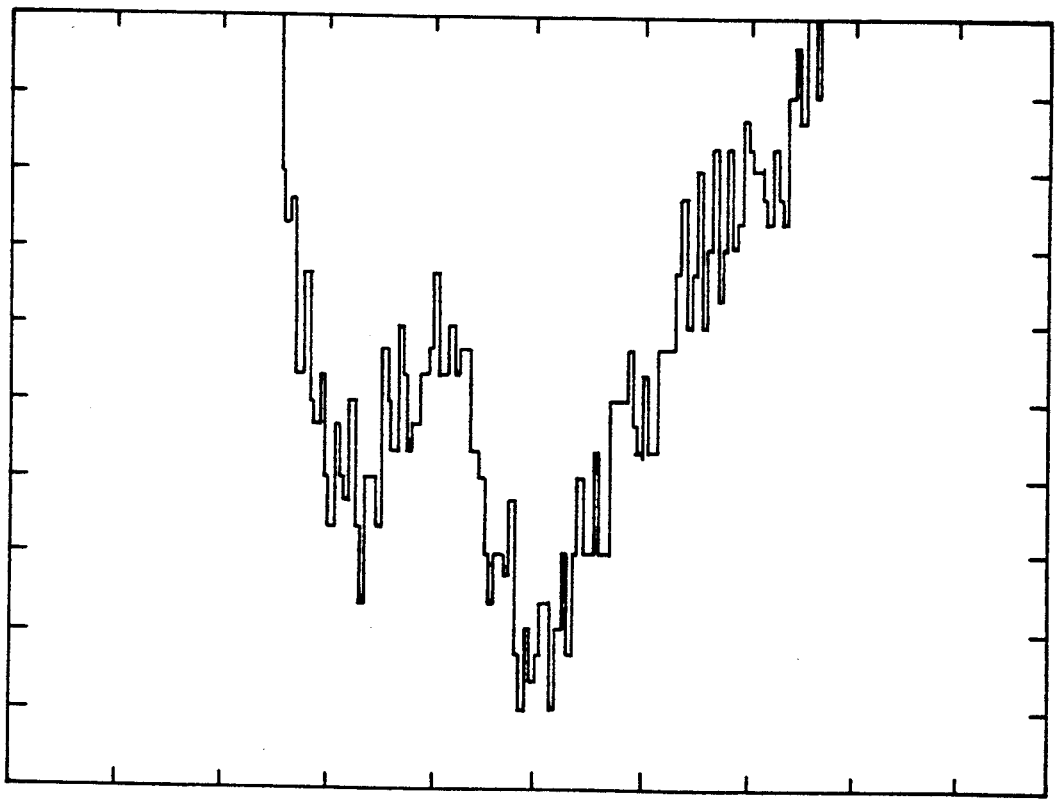
FIG. 20A is a graph showing a portion of the wave form of FIG. 20 between the fifth and sixth horizontal markings on the graph of FIG. 20.

Initially a steady DC current of approximately 0.9 amperes was imposed at one end of the pipe section being tested, and it is assumed, based upon other analysis (part of which will be disclosed later herein) that this current traveled down the length of the pipe section, and was gradually dissipating in the surrounding soil as the current progressed further along the pipeline. At the pipe locations where the pulse collision took place, as shown in the graphs of FIGS. 19 and 20, there was an electrical current flowing through the pipeline. Two positive pulses having a length of 200 nanoseconds and a voltage of 4.0 volts were being imposed upon the opposite ends of the pipe sections being tested in the manner described previously herein. It was observed that the wave form at various intersecting locations along the length of pipe was reasonably consistent, and a typical wave form configuration is illustrated in the graph of FIG. 19. The horizontal markings on the graph represent 200 nanosecond spacings. The abrupt vertical line at 114 indicates the start of the wave form at the point where the two leading edges of the pulses intersect one another, and it can be seen that this wave form drops abruptly to the low point 116, and then begins rising along the slope 118 where it reaches a reasonably consistent peak level at 120, but taking a moderate dip indicated at 122) about 150 second nanoseconds later.

As indicated above, the wave forms shown in FIG. 19 was fairly consistent along the length of pipeline. Then at one location along the pipeline, there was a variation of the wave form, and this is indicated at 124 on FIG. 20. It will be noted that between the fifth and sixth horizontal markings on the graph of FIG. 20, this occurring at about the one thousand to twelve hundred nanosecond time interval after the collision of the two leading edges of the pulses) there is an "S" shape in the curve, with the vertical deflection of the "S" being approximately a quarter of each vertical increment of the graph of FIG. 20. (Each vertical increment on the graph represents a recorded voltage change of 0.121 volt.) This "S" of the wave form had a time pulse width of about one hundred nanoseconds.

In addition to the occurrence of this "S" wave form, it was observed that the very high frequency wave component actually increased in frequency. Frequency components as high as 25 MHz to 50 MHz or possibly higher were measured. Amplitudes were 5–10 MV higher at these frequencies than measured on FIG. 19.

The actual condition of the pipe at the physical location where the pulses intersected, as shown in FIG. 20, was not inspected visually. (In other words, the earth burying the pipe at that location was not dug out so that the pipeline itself could be inspected visually.) However, it can be hypothesized with some justification that this phenomenon of the above described "S" wave form and also the frequency increase in the range of very high frequencies is due to a concentration of electrical current in that area due to a change in material thickness or quality at that location. It is surmised that where there is a change in material thickness, there will be a corresponding change in current density, which in turn would cause a change in characteristic transfer function for that point of intersection. It is further surmised that the effect may not be a "first order" amplitude effect, but will show up in a frequency response mode (i.e. a Fourier Transform, harmonic component or phase relationship of the intersecting fingerprint).

It is surmised that this effect would be experienced whether the material loss would be an external metal loss (an erosion of metal at the outside of the pipe) or an internal metal loss. Internal metal losses may be a little more challenging to find because of the obvious fact that these are inaccessible or more difficult to detect. However, when it is considered that the method of the present invention sends a pulse along the pipeline that is modified by the characteristics of the pipeline at each location, then it follows that even though the pulse travels along the outside surface, any changes in the physical or electrical characteristics of the material will be reflected to the surface.

Also, these experiments lead me to believe that changing the pulse width of the propagating pulse has the effect of injecting different frequency components into a pipeline. Actual experimental data was observed during tests to indicate that pipelines respond differently to different pulse widths. If a pipeline is uniformly protected and the coating and the pipe are in good condition, the family of wave forms will be substantially identical to each other, displaced by some constant if the pulse width is varied. However, if anomalies in the coating of the pipe appear, a response for two hundred nanosecond pulses is surmised to have a different "shape" that a response for pulses having for example, a width of eight hundred nanoseconds. If the present invention is incorporated in an automated system, then the data can be acquired very quickly and the locations where the "fingerprint" is different are the places where the quality degradation can be assumed on the pipeline.

EXAMPLE V

The following testing and analysis was accomplished by imposing a steady direct current onto an underground pipeline and then observing the characteristics of the pipeline for a period of time to see how these characteristics varied at different locations by using the pulse propagation technique of the present invention and also the prior art PSP (pipeline to soil potential) method as described in the introductory portion of this patent application under "background art".

So that the significant of this Example V can be appreciated, it should be pointed out that as indicated in the introductory portion of this text under "background art") it is a common practice to impose a negative voltage on a pipeline so that the pipeline will generally have a negative potential relative to the surrounding ground. This assists in inhibiting corrosion on the pipeline. Also, it is the common practice in the pipeline industry to impose a voltage in the pipeline for a period of time during which the pipe to soil potential readings are taken in accordance with the prior art. For example, the DC voltage would be imposed for a period of time during which readings would be made, and then readings would be made without the DC potential being imposed on the pipeline. This assists in the prior art processes of making analysis based upon these PSP (pipe to soil potential) readings.

It has been commonly assumed in the pipeline industry that when the DC voltage is imposed on the pipeline, the electrical potential conditions along the length of the pipeline will very quickly stabilize within a matter of a fraction of a minute or at least in minutes, and to the best knowledge of the applicant herein, this assumption is made in making various analysis in accordance with the prior art methods.

To direct our attention now to the testing and analysis of this Example V, the particular pipeline section under test had had the impressed current thereon off (i.e. at zero) for a full seven days. This pipeline was made of steel and had an outside diameter of 12 inches. After this zero current seven day period a steady direct current of approximately 0.9 amps was imposed at a zero location on the pipeline section, and observations were made at different locations on the pipeline. The results of this will be discussed with reference to the graphs shown in FIGS. 21 through 24.

Figure 21:
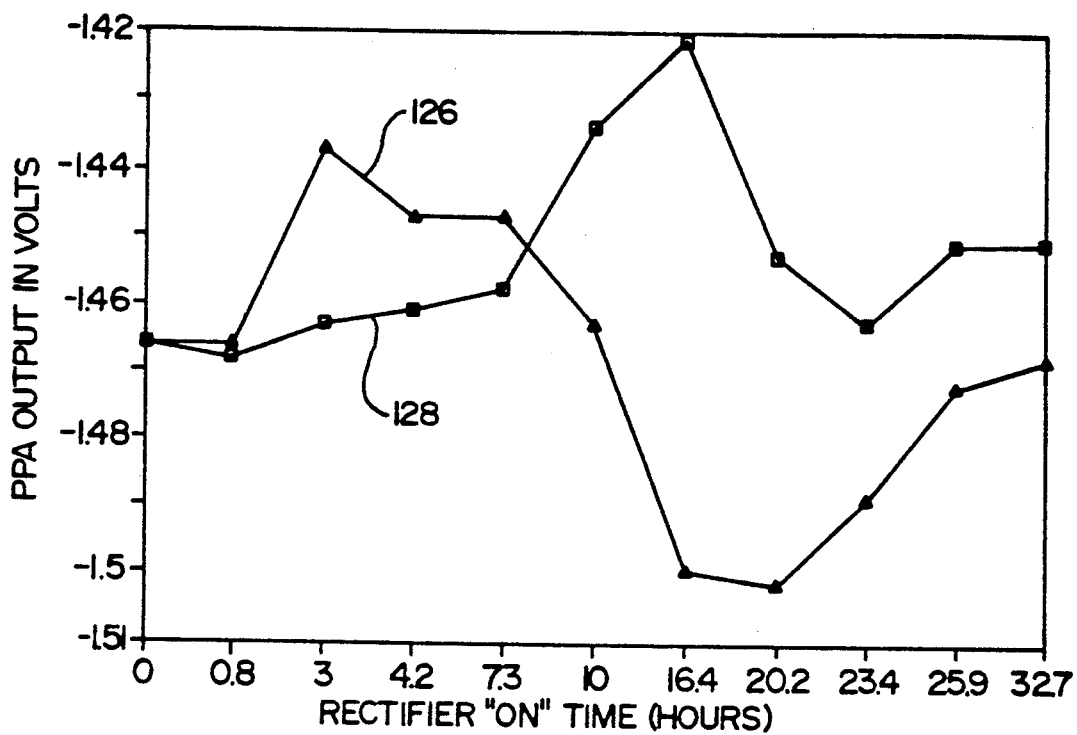
FIGS. 21, 22 and 23 are graphs which show wave forms resulting from imposing a direct current voltage onto a pipeline for extended periods, lasting many hours.

In FIG. 21 there is shown a first curve 126 which gives the pipe to soil potential readings (i.e. the prior art method described under "background art") as taken at the zero location where the constant negative voltage is applied to the pipeline. Another set of readings was taken at the same location by means of the present invention where pulses having a pulse width of 200 nanoseconds and at 4.0 volts were caused to intersect at the same zero location. The curve reflecting the reading taken from the method of the present invention is indicated at 128. The readings for the pipe to soil potential were taken during the first part of the test at intervals indicated by the time scale (Note: the scale is not linear). The pulse propagation readings in accordance with the present invention were taken at the same intervals within one or two minutes of the PSP readings. The graph in FIG. 21 shows the readings taken at the zero station for the first thirty two hours of the test. It can be seen that the pipe to soil potential readings began to change between about one and three hours. However, the pulse propagation technique of the present invention gave readings which were reasonably stable for about 7.3 hours. Then the readings taken by the two different methods began to diverge sharply from 7.3 hours to 20.2 hours, after which time the readings began to converge.

Figure 22:
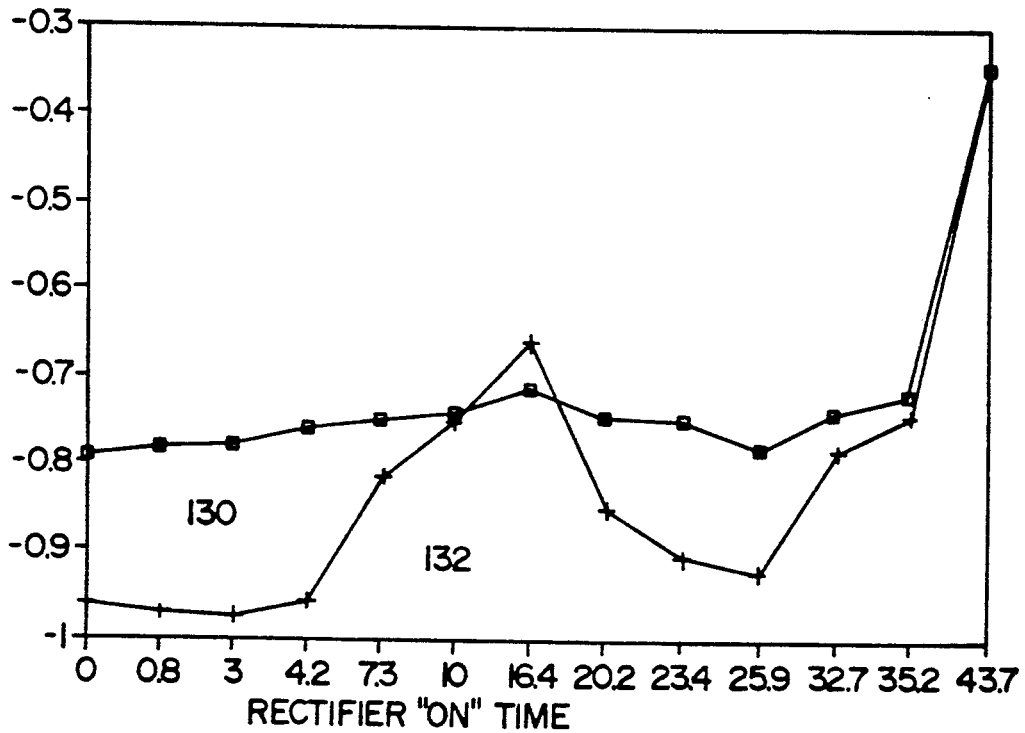

The graph of FIG. 22 shows the readings taken in accordance with the pulse propagation technique of the present invention (as described immediately above under this Example V) at locations spaced from the zero station at which the constant negative voltage was applied. More specifically the curve indicated at 130 represents pulse intersections was taken at one hundred thirty feet from the zero station at which the DC voltage was applied, and the curve indicated at 132 represents pulse intersection at a location two hundred and seventy feet from the zero station. It will be noted that the curve 132 indicated a stable condition only up until 4.2 hours, while the line readings for the curve 130, which was only one forty feet away, did not begin to change substantially until after thirty five hours. After thirty five hours, both curves 130 and 132 began to go up sharply, and as will be explained immediately below with reference to the graph of FIG. 23, this is due to a change in the weather (i.e. it began to rain).

Figure 23:
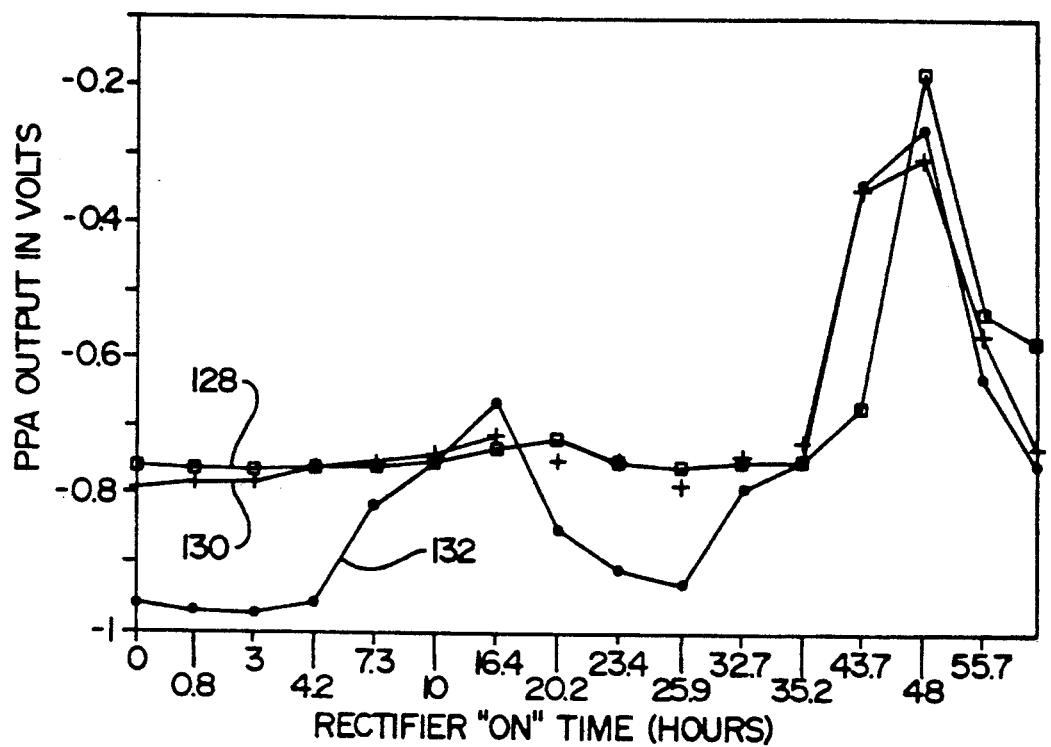

FIG. 23 shows the readings taken in accordance with the present invention at all three stations (zero station were the DC voltage is applied, shown by curve 128; the one hundred thirty foot station where the readings are shown by curve 130; and the readings at the two hundred seventy foot station shown by the curve 132). During the period of thirty five hours to forty hours, it was raining, and all of the readings at the three locations began to change simultaneously, until the rain stopped and the system began to stabilize.

The values arrived at by the pulse propagation technique of the present invention are derived by measuring the amplitude of the portion of the wave form as given in accordance with procedure outlined in Example 1. In general, where there is a decrease in amplitude, it would be expected that this would indicate an anomaly on the pipeline, such as some deterioration in the insulating material around the pipe or some other anomaly.

Figure 24:
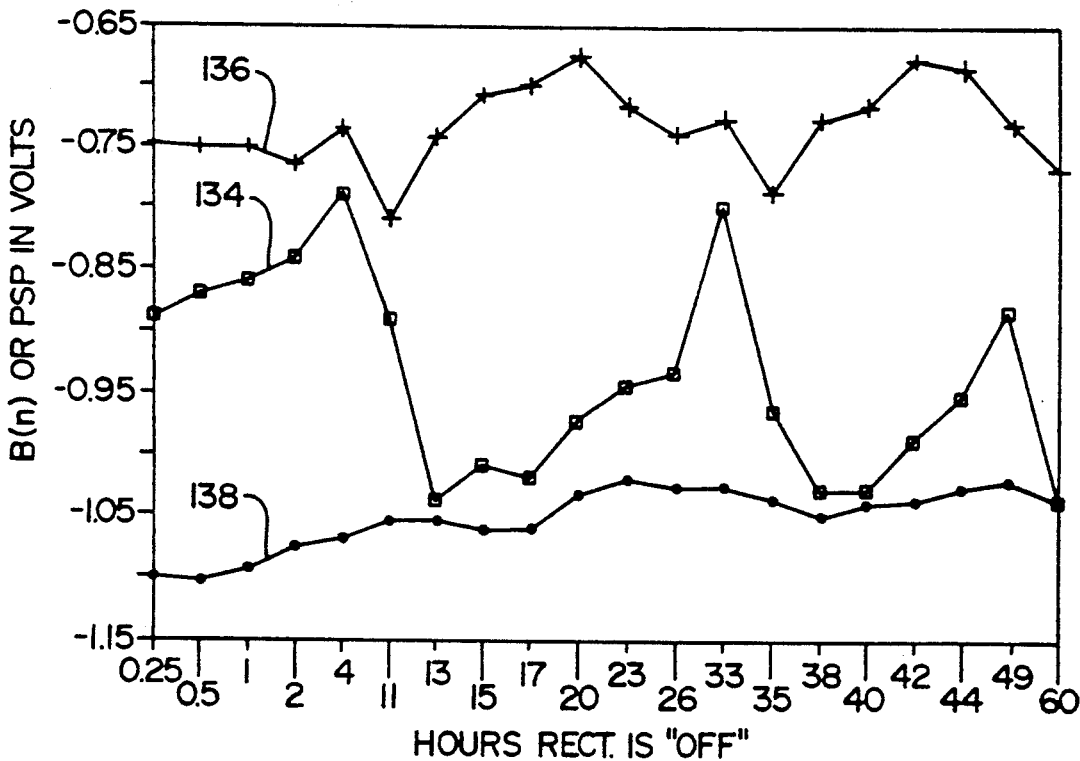
FIG. 24 is a graph illustrating the wave forms observed for a number of hours after the direct current imposed on the pipeline is shut off.

Reference is now made to the graph shown in FIG. 24, and this presents the readings taken for a sixty hour period after the DC voltage was turned off at the completion of the seventy hour test described above with reference to FIGS. 21 through 23. The curve at 134 represents the readings taken by the pulse propagation technique of the present invention at the station one hundred eighty feet from the zero station where the DC voltage had been applied. The curve 136 represents the readings taken by the pulse propagation technique of the present invention at a station two hundred twenty feet from the zero station. The curve designated 138 represents the pipe to soil readings taken at the zero station during the period beginning immediately after the DC voltage applied at the zero station was turned off and lasting for sixty hours thereafter. In general, it can be seen that there is the varying pattern of readings for the entire sixty hour period.

The phenomena described relative to FIGS. 21 through 24 can with some justification be explained by the following hypothesis. It can reasonably be concluded that over a period of time during which the surrounding soil is exposed to a certain electrical potential imposed on the nearby pipeline, the time period within which changes occur in the surrounding soil or strata will vary greatly depending upon the soil conditions encountered. For example, let it be assumed that at one location the surrounding soil acts as a good electrical insulator and is very slow to accept a charge from the adjacent pipeline. However, after a period of time, possibly many hours, the charge that is creeping through this soil area of higher insulation value finds a "channel" in the soil which is more electrically conductive. The charge built up in the more highly insulated area would tend to discharge through this channel. Also when a situation is countered where the rain falls on the soil, quite possibly the surrounding soil or strata as a whole would tend to be more electrically conductive. Or it could be that there is an electrically conductive strata or soil adjacent to the pipe which would rather quickly accept a charge, but then further propagation of electrical current from the pipeline at that location would be impeded by a surrounding insulating area.

At any rate, regardless of the accuracy of the above hypothesis, and also regardless of whether or not the hypothesis given immediately above has any validity at all, it has been found that the characteristics of the electrically related pipeline to soil conditions over a period of time after having a voltage imposed thereon (or the voltage imposed thereon terminated) does change over a period of time, which may last not only for hours, but for days.

This is significant for two reasons. First, this can be used as an analytical tool. For example, the voltage can be imposed on the pipeline for a prolonged period of time (e.g. many hours, or even for days), and the pulse propagation technique of the present invention could be used to analyze the readings to detect polarization conditions. For example, if a section of the pipe would polarize and depolarize rather rapidly, this could well indicate a situation where there is bad coating or some other problem. Second, this phenomenon described in this Example V can also be used in combination with the techniques of analyzing the various "fingerprints" achieved by the method of the present invention to "fine tune" the readings. For instance, the readings taken through the method of the present invention would have to be interpreted in light of what has been happening on the pipeline for the period prior to the time (and during the time) these readings are taken. For example, with reference to FIG. 24, if the readings are taken at the one hundred and eighty foot station four hours after the applied voltage is turned off, the readings would be interpreted differently than if the same readings were taken thirteen hours after the applied voltage was turned off, because of the dramatic change in the readings as shown on the curve 134 in FIG. 24 during that time interval.

EXAMPLE VI

Figure 25:
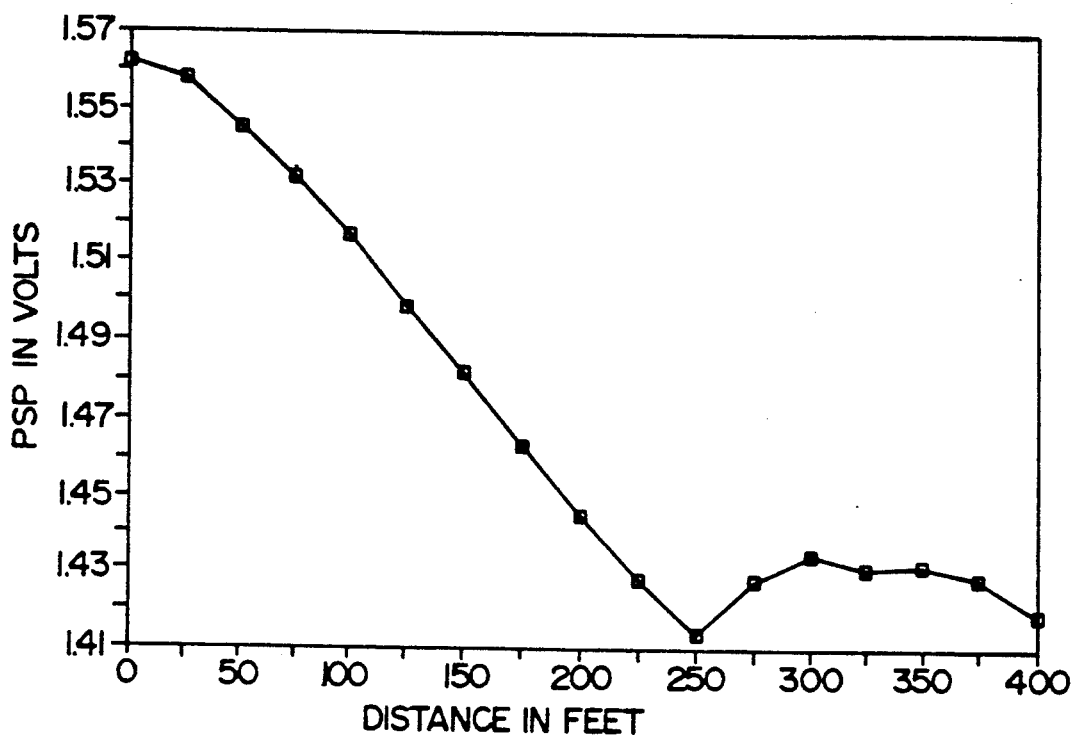
Figure 26:
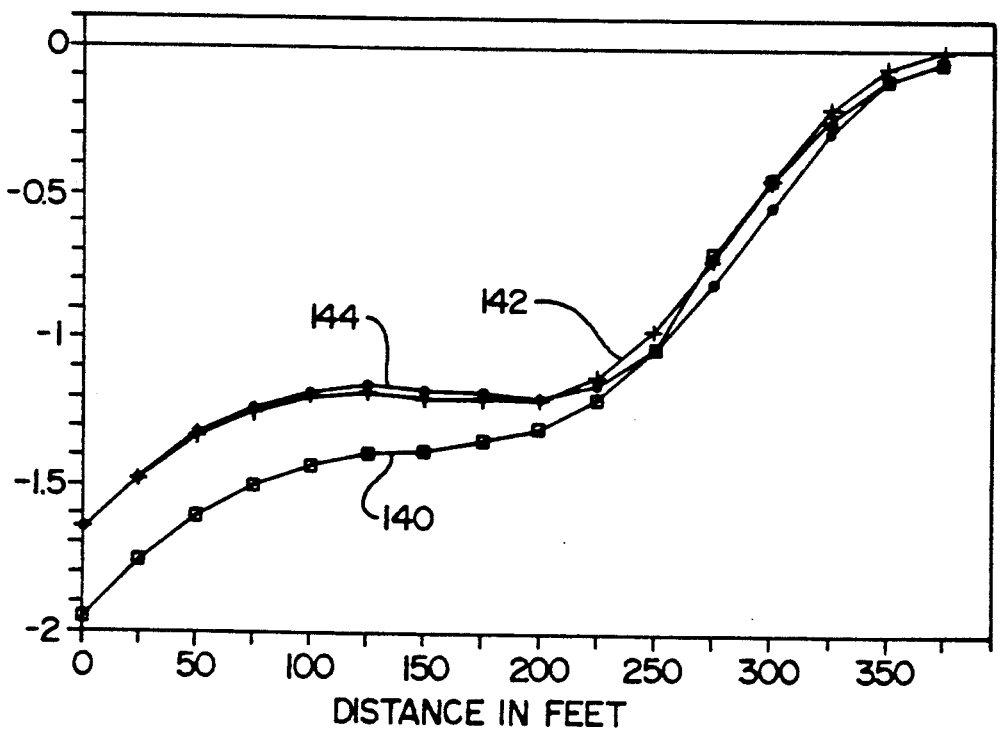

Reference is made to FIGS. 25, 26 and 27. A source of constant DC current was applied at 0.700 amps relative to ground potential at a zero station on an underground pipeline made of metal and having an outside diameter of 6 inches. More specifically, this was accomplished by placing an anode into the ground at a location spaced from the pipeline, and then applying the DC voltage generator between the anode and the pipeline at the zero location.

Then, pipe to soil potential was measured in accordance with the prior art half cell method at twenty five foot locations along the length of the pipeline. The results of these readings are given in the graph of FIG. 25.

Then the pulse propagation technique of the present invention was used to analyze the conditions along the same four hundred foot length of the pipeline. The pulses were imposed at the zero location on the pipeline and at the four hundred foot location. The width of the pulses was 200 nanoseconds, and three test runs were made where the pulse intersection point was stepped at twenty five foot intervals along the four hundred length of pipe. The first run along the length of the pipe was made with the current imposed during transmission of the pulses being 700 milliampers, the results being shown in the curve 140. The second run of pulses along the four hundred foot length was applied at a voltage level of eight hundred eight milliampers at the zero station, the results being shown in the curve 142. The third run was accomplished with the voltage imposed in the pipeline of the pulses being at nine hundred and ninety milliamperes, the results being shown at the curve at 144.

To interpret the results displayed on the graphs of FIGS. 25 and 26, it should be understood that the DC current imposed at station zero would be at a maximum, and as the current flows down the length of the pipe toward the four hundred foot station (i.e. assuming current flows from negative to positives), the current level becomes less and less, since the current is being picked up incrementally from 400 feet away to about zero. The pipe to soil potential readings in FIG. 25 indicate this declining current as one proceeds further toward the four hundred foot station. The curves presented in FIG. 26 actually display a similar result. This is because the numerical values having greater absolute value in a negative direction would correspond to locations having a higher value. Thus, the results presented in the graph of FIG. 25 co-relate reasonably closely with the results displayed in the graph of FIG. 26. Using the terminology more commonly employed in this art (i.e. that current flows from positive to negative), current is picked up along the length of the pipe and is at a maximum at the zero station.

There are two testing applications that could be derived from this phenomenon. First, the recognition of how the current declines along the length of the pipeline would provide a tool to interpret the data which could be obtained not only by the pulse propagation technique of the present invention, but also with the pipe to soil potential method. However, this technique shows vasty improved results by use of the pulse propagation technique of the present invention. Second, by examining the slope of the curve, it may be possible to detect a defect which causes larger quantities of current to flow out of the pipeline and into the surrounding soil at a particular location. Where this is occurring, it would be expected that the current on one side of the defective location would be a much higher level and drop abruptly at the fault location so that the current would be much lower on the opposite side of the fault location.

For example, areas where coating is bad will show increase in current being picked up at that location.) It is interesting to compare the degree of change between PSP prior at method and the present invention, and to do so reference is now made to the graph of FIG. 27. This graph compares the percentage of change in the readings achieved by the present invention (see FIG. 26) and the percentage of change achieved by the pipe to soil potential readings of FIG. 25. It can be seen that at about the two hundred fifty foot station in FIG. 6, there is a dramatic rise in percentage of change (i.e. twenty five percent in comparison with only a two percent change by use of the PSP method. In this instance, the area at the location where this abrupt change was indicated by the method of the present invention was dug out, and a serious flaw in the pipeline was discovered. Further, this flaw was sufficiently serious so that it required repair at this pipeline location.

Thus, it is surmised that the method of the present invention can be used with a pipeline not only to ascertain data that would correspond to the pipe-to-soil potentials obtained by the half-cell method of determining electrical potential between the ground and a pipe, but also would have the capability of detecting other anomalies.

Further, it is apparent from reviewing the examples given above that various types of changes in the fingerprint of the intersecting pulse can yield valuable information. This change could be an amplitude variation in a major portion of the fingerprint, a frequency variation, a "blip" or minor wave variation, etc. Further, superimposed on this is the discovery that current variations along the length of the pipeline or other member can be an analytical tool, and also an instrument to fine tune the readings taken by the pulse propagation method. Further, the discovery that the conditions relating to electrical potential along the pipeline can vary over a period of time provides yet another analytical tool, and one that enables the fine tuning of the pulse propagation technique of the present invention.

Figure 14:
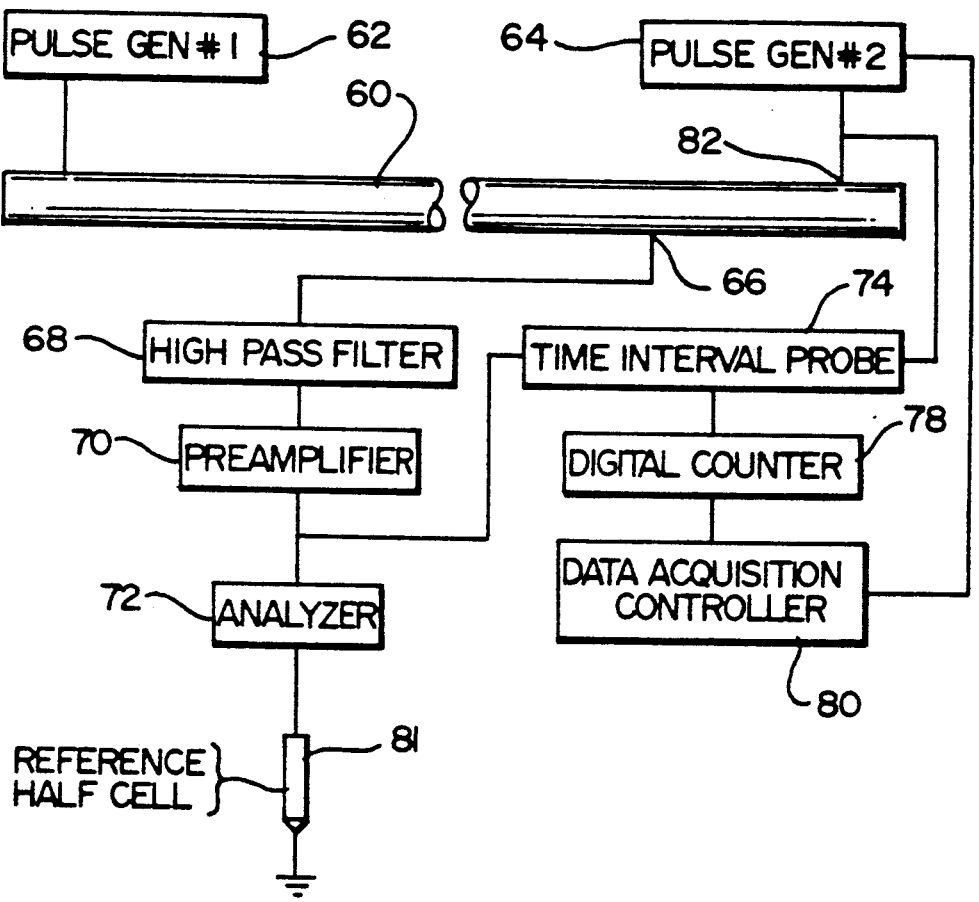
FIG. 14 is a schematic view illustrating a proposed commercial embodiment of the present invention.

In FIG. 14, there is shown a system which would be suitable for use in a commercial operation, and this particular subject matter was disclosed in U.S. Pat. No. 4,970,467. There is shown a pipe line 60, which can be an oil pipeline which would extend under ground for many miles, and at two locations on this pipe line, there are first and second pulse generators 62 and 64, respectively. These would desirably be precision pulse generators with time delay capability, such as SRS Model DG535, Hewlett Packard Model 8161A, or Berkeley Nucleonics Model 7085. These two pulse generators 62 and 64 are connected to the pipeline at a distance which could be as small as a few hundred feet, or possibly as great as one hundred miles or possibly greater. At a predetermined distance from the pulse generator 64, there is a receiving and analyzing location 66 which could be, for example, between one hundred to five hundred feet from the location of the pulse generator 64. This connection to the pipe line at 66 in turn leads to a high pass filter 68 such as a Hewlett Packard Model 1166BA, and the output from the filter is transmitted to a preamplifier 70, such as a 2-1300 mhz or equivalent amplifier such as Hewlett Packard 10855A.

The output from the preamplifier 70 is directed two places, first to an analyzer 72 (.e.g. a digital oscilloscope, a spectrum analyzer, or a wave form analyzer (e.g. Tektronic Model 2430A or Hewlett Packard 54111D (two gigasample/second)), and second to a time interval probe 74, such as a Hewlett Packard Model 53638. There is also a fast precision digital counter 78, such as Hewlett Packard Model 5345A that is connected to the time interval probe 74, and the counter 78 is in turn connected to a data acquisition controller 80, such as an Hewlett Packard series 300 Technical Computer, an IBM System II, or a Concurrent Computer Corporation Scientific Laboratory System. Finally, there is a half-cell 81, such as that described previously herein, and which is used as an industry standard.

As indicated previously the pulse generators 62 and 64 connect to the pipe 60 at locations along the pipe that are many miles apart. The connection at 66 is a data collection point that is located an accurately measured distance from the connection of the pulse generator 64 to the pipe 60. This connection at 66 is used to synchronize pulses and to aide in calibrating the pulse velocity through the pipeline.

In operation, the two pulse generators 62 and 64 generate short duration pulses preferably ranging from five nano seconds to one hundred nano seconds. However, pulses of shorter or longer duration could also be practical for certain situations depending on the length of the line being tested and other circumstances. The high pass filter 68 is used to select portions of the signals arriving from the pulse generators 62 and 64 and to synchronize the pulses from pulse generator 64 with those being emitted from the pulse generator 62. The preamplifier 70 amplifies and conditions the high frequency signals to a level that can be used by the time interval probe 74. The probe 74, in conjunction with the digital counter 78, is utilized to synchronize the pulses produced by the pulse generators 62 and 64.

The propagation time of the pulse from the pulse generator 64 to the location of this connection 82 through the pipe 60 to the point 66 can be measured in several ways. One method would be to measure the delay time of a pulse from the generator 64 traveling from point 82 to point 66. The physical distance from point 82 to point 66 can be measured and the time interval can be measured by the probe 74 and the counter 78.

The data acquisition controller 80 receives the data from the digital counter and it can be programmed to simply step the point of intersection along the length of the pipeline 60 by synchronizing the pulses between the two generators 62 and 64 Also, the data acquisition controller 80 can be used to store the signature of the wave forms derived from the analyzer 72. Also, it is to be understood that the components 68-80 can be duplicated at the location of the pulse generator 62. In fact, in a commercial installation, it is likely that the components 60-81 would be duplicated at the location of the pulse generator 62, since this would enable the system to check the timing of the pulses more accurately (i.e. the time interval traveling from pulse generator 62 to pulse generator 64, and also the timing of the travel from the two pulse generators to the detection location 66).

It is believed that the manner in which the apparatus of FIG. 14 can be utilized to step the point of intersection along the pipeline 60 and record the wave forms is evident from the detailed description given in connection with the examples given previously herein. However, to summarize this briefly, in a typical operation a pulse is sent from the pulse generator 62 to travel to the location 82 adjacent to the pulse generator 64. The rate of travel of the pulse can be ascertained in a manner indicated above, and the length of the pipeline 60 would be known from the original installation. As subsequent pulses are generated from the pulse generator 62, the time interval probe 74 and the digital counter 78 can be utilized in conjunction with the data acquisition controller 80 to provide corresponding pulses from generator 64 which would be initiated at successively earlier time intervals so that the point of intersection is stepped in given increments toward the location of the pulse generator 62.

Another apparatus or systems which was developed more recently than that shown in FIG. 14 is illustrated in FIG. 28. Since this system is described more fully in my co-filed application "APPARATUS AND METHOD FOR PULSE PROPAGATION ANAYLSIS OF A PIPELINE OR THE LIKE", incorporated herein by reference, only a very brief description will be given of this system. In FIG. 21, the system 110 is particularly well adapted for testing a pipeline 112 that extends underneath a river 114 or some other physical barrier. There is a first pulse generator 116 located near point A, a second pulse generator 118 located near point B, and a signal analyzer 20 also located near point A. Pulse generator 116 and 118 are or can be those manufactured by Stanford Research, identified by Model No. DG 535. The output terminals 122 and 124 of the pulse generators 116 and 118 are connected to points A and B of pipe 112 by cables 126 and 128.

The signal analyzer 120, which is or may be one manufactured by TEK and identified as Model No. DSA 501A, contains plug-in units 130 and 132, such as Model Nos. 4A32 manufactured by TEK. The cable 126 connected to point a is also connected to the input terminal 134 of the signal analyzer plug-in unit 126 into a trigger input terminal 136 of the first pulse generator 116 to a delay line 138. The purpose of this delay line 138 is to insure that the pulses generated by the first pulse generator 116 do not collide and interfere with the earlier pulses sent from the second pulse generator 118. A second output terminal 140 of the pulse generator 116 is connected to an input terminal 142 of the signal anaylzer plug-in unit 132.

Very briefly, the system shown in FIG. 28 operates by first determining the time distance of the pipeline section being tested by means of sending a pulse from one end to the other and then sending a return pulse after which the appropriate time interval is measured. Then pulses are transmitted from the generator 118 at regular intervals from point B to point A. The timing of the pulses from point A can be accomplished by counting time from the arrival of the previous pulse. With the time intervals at which the pulses 119 being quite precise and known at location A, the stepping of the point of intersection along the length of pipeline 112 can be precisely controlled. Other details of the operation of this system are disclosed in the above mentioned patent application entitled "APPARATUS AND METHOD FOR PULSE PROPAGATION ANALYSIS OF A PIPELINE OR THE LIKE", filed concurrently herewith.

It is to be understood that various modifications could be made without departing from the basic techings of the present invention.

What is claimed is:

1. A method of detecting an anomaly along an electrically conductive member having a lengthwise axis, said method comprising:
   a. applying a D.C. electrical current to said member to provide an electrical potential in a manner that said current flows along said member;
   b. causing a first electrical pulse to travel from a first location on said axis along said member toward a second location on said axis:
   c. causing a second electrical pulse to travel from said second location along said member toward said first location with said second pulse being synchronized with said first pulse in a manner that there is an intersection of said first and second pulses at a first intersecting location along said axis;
   d. detecting and analyzing at least one of said first and second pulses after passing through said intersecting location to ascertain modification of said one of said pulses;
   e. said analysis being conducted by observing changes of said electrical potential between said member and said ground in which said member is contained and correlating this to analysis of at least one of said first and second pulses.

2. The method as recited in claim 1, wherein said analysis is conducted by observing frequency variations of at least one of said first and second pulses.

3. The method as recited in claim 2, wherein said analysis is conducted to determine variations in at least one of said first and second pulses relating to current density at a location along said member.

4. The method as recited in claim 1, wherein said member is contained in another material, and the current imposed on said member flows to some extent along said member into said material.

5. The method as recited in claim 4, wherein said member is buried underground, and current flows from said member into said material which is surrounding ground.

6. The method as recited in claim 5, wherein said analysis is conducted by detecting an area along said member where there is greater current flow between said member and said surrounding ground.

7. The method as recited in claim 1, wherein said analysis is conducted by observing electrical potential changes between said member and said ground in which said member is contained and correlating this to analysis of at least one of said first and second pulses.

8. A method of detecting an anomaly along an electrically conductive member having a lengthwise axis, said method comprising:
   a. applying an electrical current to said member to provide an electrical potential in a manner to cause said electrical current to flow along said member.
   b. causing a first electrical pulse to travel from a fist location on said axis along said member toward a second location in said axis;
   c. causing a second electrical pulse to travel from said second location along said member toward said first location with said second pulse being synchronized with said first pulse in a manner that there is an intersection of said first and second pulses at a first intersecting location along said axis;
   d. detecting and analyzing at least one of said first and second pulses after passing through said intersecting location to ascertain modification of said one of said pulses, said analysis being conducted by observing frequency variations of at least one of said first and second pulses;
   e. said analysis being conducted by observing changes of said electrical potential between said member and said ground in which said member is contained and correlating this to analysis of at least one of said first and second pulses.

9. The method as recited in claim 8, wherein said analysis is conducted to determine variations in at least one of said first and second pulses relating to current density at a location along said member.

10. A method of detecting an anomaly along an electrically conductive member having a lengthwise axis, said method comprising:
    a. applying an electrical current to said member to provide an electrical potential in a manner to cause said electrical current to flow along said member.
    b. causing a first electrical pulse to travel from a fist location on aid axis along said member toward a second location in said axis;
    c. causing a second electrical pulse to travel from said second location along said member toward said first location with said second pulse being synchronized with said first pulse in a manner that there is an intersection of said first and second pulses at a first intersecting location along said axis;
    d. detecting and analyzing at least one of said first and second pulses after passing through said intersecting location to ascertain modification of said one of said pulses, said analysis being conducted by observing frequency variations of at least one of said first and second pulses.
    e. said member is contained in another material, and the current imposed on said member flows to some extent along said member into said material;
    f. said analysis being conducted by observing changes of said electrical potential between said member and said ground in which said member is contained and correlating this to analysis of at least one of said first and second pulses.

11. The method as recited in claim 10, wherein said member is buried underground, and current flows from said member into said material which is surrounding ground.

12. The method as recited in claim 11, wherein said analysis is conducted by detecting an area along said member where there is greater current flow between aid member and said surrounding ground.

13. A method of detecting an anomaly along an electrically conductive member having a lengthwise axis, said method comprising:
    a. applying an electrical current to said member to provide an electrical potential;
    b. causing a first electrical pulse to travel from a first location on said axis along said member toward a second location on said axis;
    c. causing a second electrical pulse to travel from said second location along said member toward said first location with said second pulse being synchronized with said first pulse in a manner that there is an intersection of said first and second pulses at a first intersecting location along said axis;
    d. detecting and analyzing at least one of said first and second pulses after passing through said intersecting location to ascertain modification of said one of said pulses;
    e. said analysis being conducted by observing changes of said electrical potential between said member and said ground in which said member is contained and correlating this to analysis of at least one of said first and second pulses.

* * * * *